US008665629B2

(12) United States Patent
Park et al.

(10) Patent No.: US 8,665,629 B2
(45) Date of Patent: Mar. 4, 2014

(54) CONDENSED MEMORY CELL STRUCTURE USING A FINFET

(75) Inventors: Human Park, Paris (FR); Ulrich Klostermann, Munich (DE); Rainer Leuschner, Samoreau (FR)

(73) Assignees: Qimonda AG, Munich (DE); Altis Semiconductor, SNC, Corbeil Essonnes Cedex (FR)

( * ) Notice: Subject to any disclaimer, the term of this patent is extended or adjusted under 35 U.S.C. 154(b) by 1537 days.

(21) Appl. No.: 11/864,575

(22) Filed: Sep. 28, 2007

(65) Prior Publication Data

US 2009/0085121 A1  Apr. 2, 2009

(51) Int. Cl.
*G11C 11/00* (2006.01)

(52) U.S. Cl.
USPC ........... 365/148; 365/163; 365/158; 365/171; 365/173

(58) Field of Classification Search
USPC .......................... 365/148, 158, 163, 171, 173
See application file for complete search history.

(56) References Cited

U.S. PATENT DOCUMENTS

| | | | | |
|---|---|---|---|---|
| 5,640,343 A * | 6/1997 | Gallagher et al. | ............ | 365/171 |
| 6,097,625 A * | 8/2000 | Scheuerlein | ................. | 365/171 |
| 6,940,747 B1 * | 9/2005 | Sharma et al. | ................ | 365/158 |
| 7,002,195 B2 * | 2/2006 | Park | ............................. | 257/295 |
| 7,212,432 B2 | 5/2007 | Ferrant et al. | | |
| 7,286,394 B2 * | 10/2007 | Ooishi | ........................ | 365/158 |
| 7,309,885 B2 * | 12/2007 | Park et al. | ..................... | 257/211 |
| 7,345,899 B2 * | 3/2008 | Nirschl et al. | .................. | 365/63 |
| 7,397,689 B2 * | 7/2008 | Liu et al. | ...................... | 365/148 |
| 7,474,555 B2 * | 1/2009 | Nirschl et al. | ................. | 365/163 |
| 7,606,055 B2 * | 10/2009 | Liu | ................................. | 365/51 |
| 7,723,786 B2 * | 5/2010 | Kakoschke et al. | ........... | 257/347 |
| 2006/0067112 A1 * | 3/2006 | Ferrant et al. | ................ | 365/158 |
| 2006/0077737 A1 * | 4/2006 | Ooishi | ........................ | 365/203 |
| 2009/0014706 A1 * | 1/2009 | Lung | ............................... | 257/4 |
| 2013/0148409 A1 * | 6/2013 | Chung | ......................... | 365/148 |

* cited by examiner

*Primary Examiner* — Vu Le
*Assistant Examiner* — Han Yang
(74) *Attorney, Agent, or Firm* — John S. Economou

(57) ABSTRACT

An integrated circuit and method for manufacturing an integrated circuit are described. In one embodiment, the integrated circuit includes a memory cell that includes a resistivity changing memory element. The resistivity changing memory element is electrically coupled to a select transistor that includes a FinFET including a source, a drain, and a fin structure formed above a surface of a substrate between the source and the drain. The fin structure includes a channel area extending in a direction substantially parallel to the surface of the substrate, and a dielectric layer formed around at least a portion of the channel area such that an effective channel width of the select transistor depends at least in part on a height of the fin structure.

14 Claims, 28 Drawing Sheets

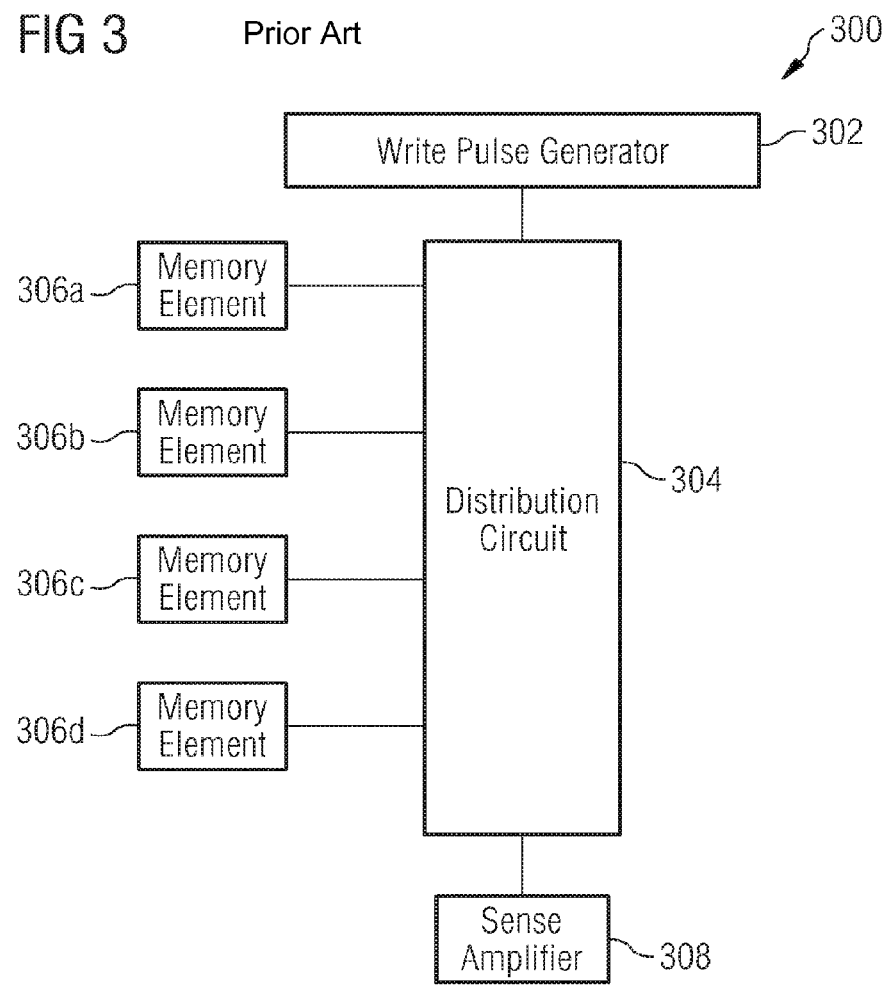
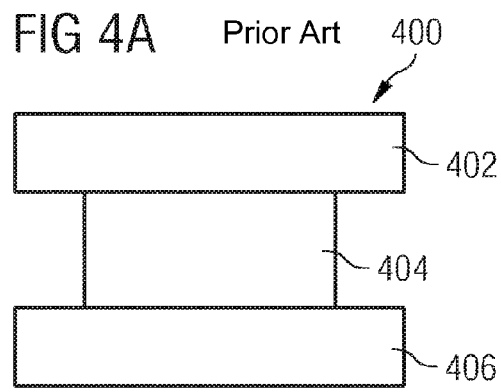
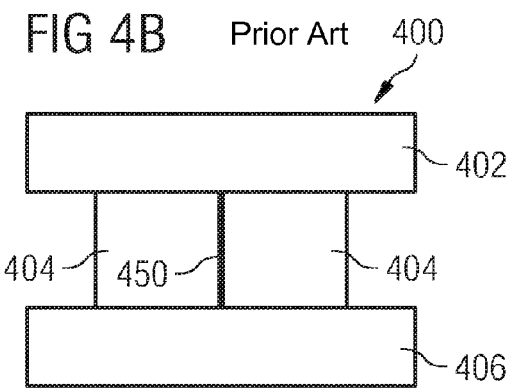

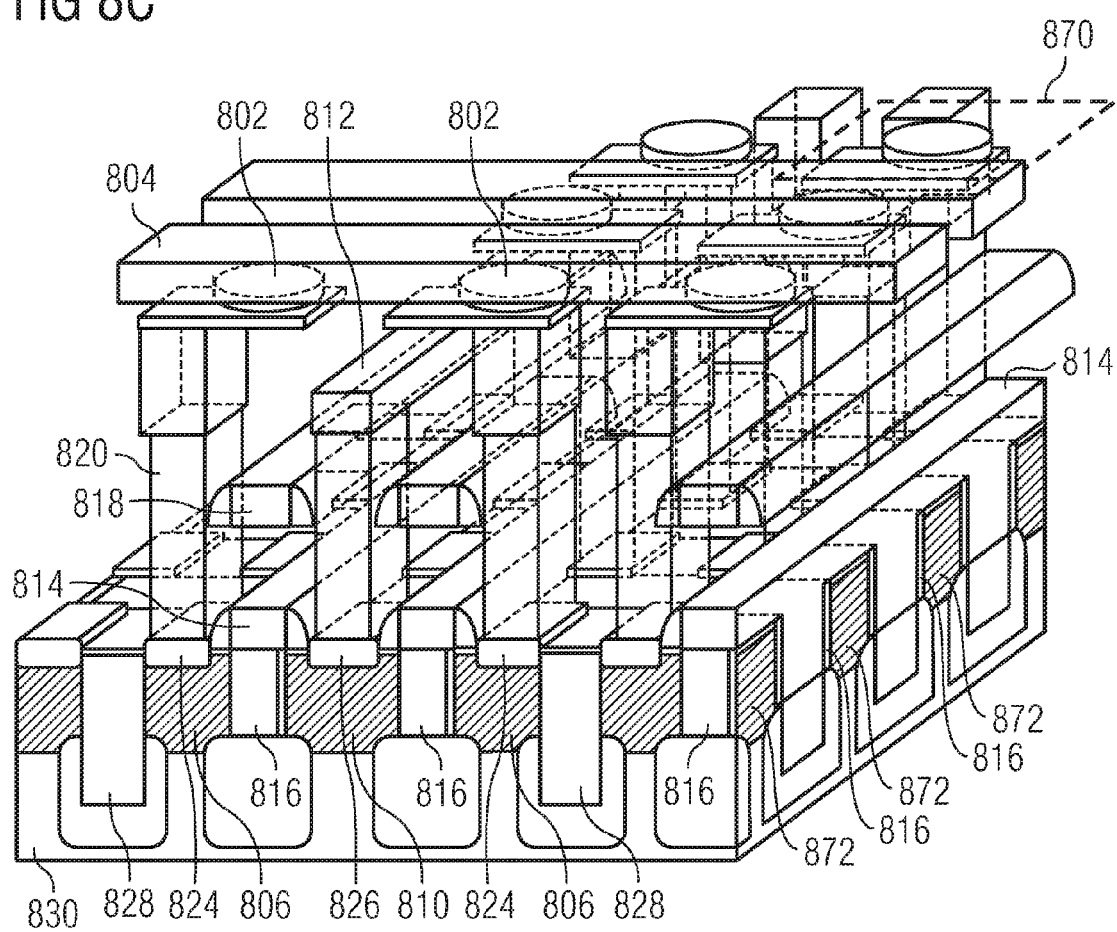

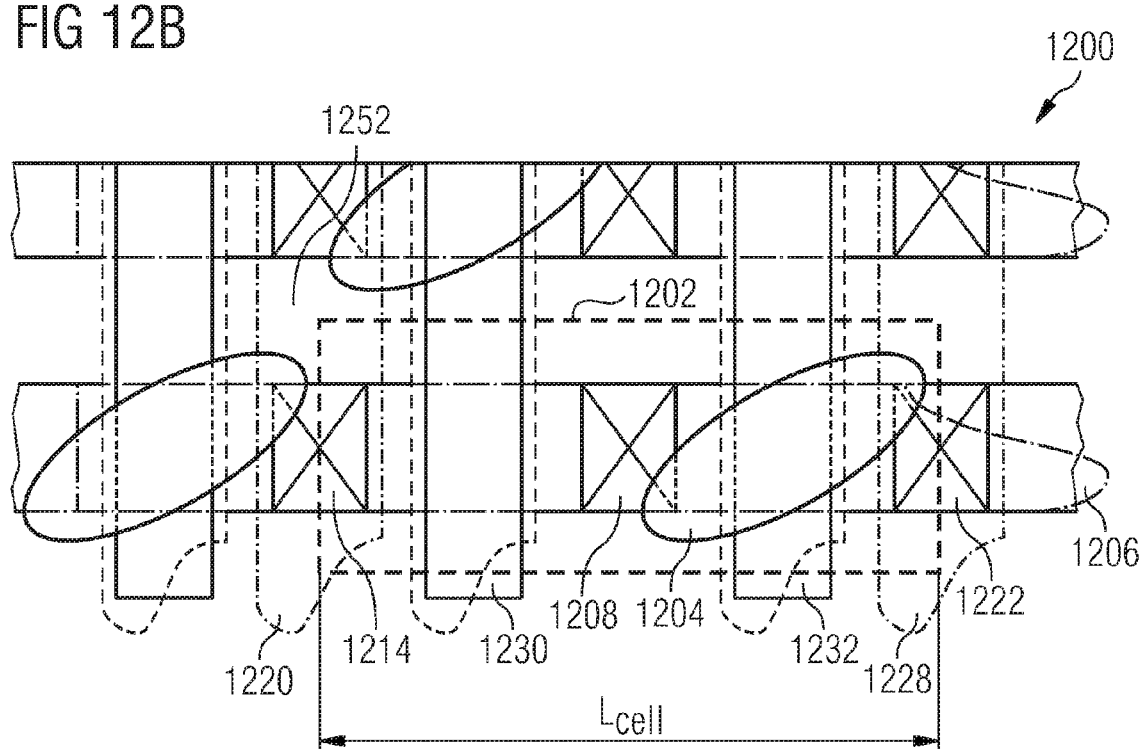

US 8,665,629 B2

CONDENSED MEMORY CELL STRUCTURE USING A FINFET

BACKGROUND OF THE INVENTION

Memory devices are used in essentially all computing applications and in many electronic devices. For some applications, non-volatile memory, which retains its stored data even when power is not present, may be used. For example, non-volatile memory is typically used in digital cameras, portable audio players, wireless communication devices, personal digital assistants, and peripheral devices, as well as for storing firmware in computers and other devices.

A variety of memory technologies have been developed. Non-volatile memory technologies include flash memory, magnetoresistive random access memory (MRAM), phase change random access memory (PCRAM), and conductive bridging random access memory (CBRAM). Due to the great demand for memory devices, researchers are continually improving memory technology and developing new types of memory, including new types of non-volatile memory.

The scale of electronic devices is constantly being reduced. For memory devices, conventional technologies, such as flash memory and DRAM, which store information based on storage of electric charges, may reach their scaling limits in the foreseeable future. Additional characteristics of these technologies, such as the high switching voltages and limited number of read and write cycles of flash memory, or the limited duration of the storage of the charge state in DRAM, pose additional challenges. To address some of these issues, researchers are investigating memory technologies that do not use storage of an electrical charge to store information. One such technology is resistivity changing memory, which stores information based on changes in the resistivity of a memory element. Depending on the resistivity changing memory technology being used, the resistivity of the storage layer is typically switched between a low resistivity state and a high resistivity state through the application of voltage or current across the storage layer.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIG. 3 shows a block diagram of a memory device using resistivity changing memory elements;

FIGS. 4A and 4B illustrate the operation of a carbon memory cell;

FIGS. 8A-8C show an example integrated circuit memory device according to an embodiment of the invention;

FIGS. 12A-12C show an integrated circuit memory device in which two FinFETs are used to drive the switching current of a resistivity changing memory element, in accordance with an embodiment of the invention;

DETAILED DESCRIPTION OF ILLUSTRATIVE EMBODIMENTS

Figure 1:
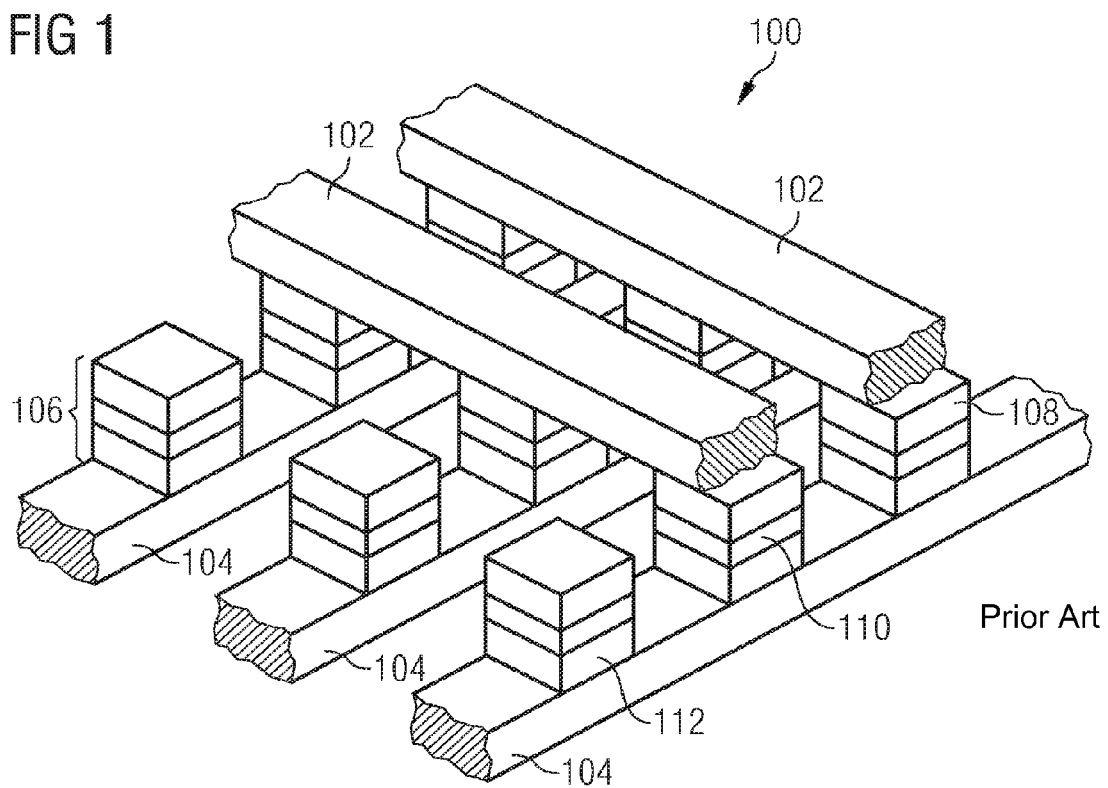
FIG. 1 shows a portion of a conventional magnetoresistive memory (MRAM) device.

One type of resistivity changing memory is magnetoresistive random access memory (MRAM). FIG. 1 shows a perspective view of an MRAM array 100 having bit lines 102 disposed in an orthogonal direction to word lines 104 in adjacent metallization layers. Magnetoresistive memory elements 106 are electrically coupled to the bit lines 102 and word lines 104, and are positioned between the bit lines 102 and word lines 104 at locations where a bit line 102 crosses a word line 104. The magnetoresistive memory elements 106 may include a free layer 108, a tunnel layer 110, and a fixed layer 112. The free layer 108 and fixed layer 112 may each include a plurality of magnetic metal layers (not shown). These magnetic metal layers may, for example, include eight to twelve layers of materials such as PtMn, CoFe, Ru, and NiFe. The tunnel layer 110 may include a dielectric, such as $Al_2O_3$.

The fixed layer 112 may be magnetized in a fixed direction, while the direction of magnetization of the free layer 108 may be switched, changing the resistance of the magnetoresistive memory element 106. One bit of digital information may be stored in a magnetoresistive memory element 106 by running a current in the appropriate direction through the bit line 102 and the word line 104 that intersect at the selected magnetoresistive memory element 106, creating a sufficient magnetic field to set the direction of magnetization of the free layer 108. Information may be read from a magnetoresistive memory element 106 by applying a voltage across the memory element, and measuring the resistance. For example, if the direction of magnetization of the free layer 108 is parallel to the direction of magnetization of the fixed layer 112, then the measured resistance may be low, representing a value of "0" for the bit. If the direction of magnetization of the free layer 108 is anti-parallel to the direction of magnetization of the fixed layer 112, then the resistance may be high, representing a value of "1".

It will be understood that the view shown in FIG. 1 is simplified, and that actual MRAM cells may include additional components. For example, in some MRAM designs, known as thermal select MRAM devices, switching of the free layer is facilitated by using a heating current to heat the free layer to a temperature that permits its direction of magnetization to be more easily switched. This can be used, for example, to prevent inadvertent switching of nearby cells in a densely-packed MRAM array. As will be discussed below, such thermal select MRAM cells may include a transistor, as well as a magnetoresistive memory element. The transistor may be used to select the cell, and to drive the current that is used for heating the cell. For example, a word line may be used to select a cell by being electrically connected to the gate of the transistor, so that a heating current flows through the cell from the bit line when the transistor is selected. The select transistor may also be used for selecting the read current path to read out the cell resistance. Such a select transistor may also be used in spin-injection MRAM memory cells, or other types of MRAM cells. Other variations that include a variety of components in the design of a memory cell also are possible.

It will further be recognized that the view shown in FIG. 1 represents only a small portion of an actual MRAM device. Depending on the organization and memory capacity of the device, there may be hundreds or thousands of bit lines and word lines in a memory array. For example, a 1 Mb MRAM device (i.e., an MRAM device storing approximately one million bits of data) may include two arrays, each of which has 1024 word lines and 512 bit lines. Additionally, in some MRAM devices, there may be multiple layers of memory elements, which may share bit lines and/or word lines.

Another type of resistivity changing memory is known as phase change random access memory (PCRAM). The resistivity changing memory elements used in PCRAM are phase changing memory elements that include a phase changing material. The phase changing material can be switched between at least two different crystallization states (i.e., the phase changing material may adopt at least two different degrees of crystallization), wherein each crystallization state may be used to represent a memory state. When the number of possible crystallization states is two, the crystallization state having a high degree of crystallization is also referred to as a "crystalline state", whereas the crystallization state having a low degree of crystallization is also referred to as an "amorphous state". Different crystallization states can be distinguished from each other by their differing electrical properties, and in particular by their different resistances. For example, a crystallization state having a high degree of crystallization (ordered atomic structure) generally has a lower resistance than a crystallization state having a low degree of crystallization (disordered atomic structure). For sake of simplicity, it will be assumed in the following that the phase changing material can adopt two crystallization states (an "amorphous state" and a "crystalline state"), however it will be understood that additional intermediate states also may be used.

Phase changing memory elements may change from the amorphous state to the crystalline state (and vice versa) due to temperature changes of the phase changing material. These temperature changes may be caused using different approaches. For example, a current may be driven through the phase changing material (or a voltage may be applied across the phase changing material). Alternatively, a current or a voltage may be fed to a resistive heater which is disposed adjacent to the phase changing material. To determine the memory state of a resistivity changing memory element, a sensing current may routed through the phase changing material (or a sensing voltage may be applied across the phase changing material), thereby sensing the resistivity of the resistivity changing memory element, which represents the memory state of the memory element.

Figure 2:
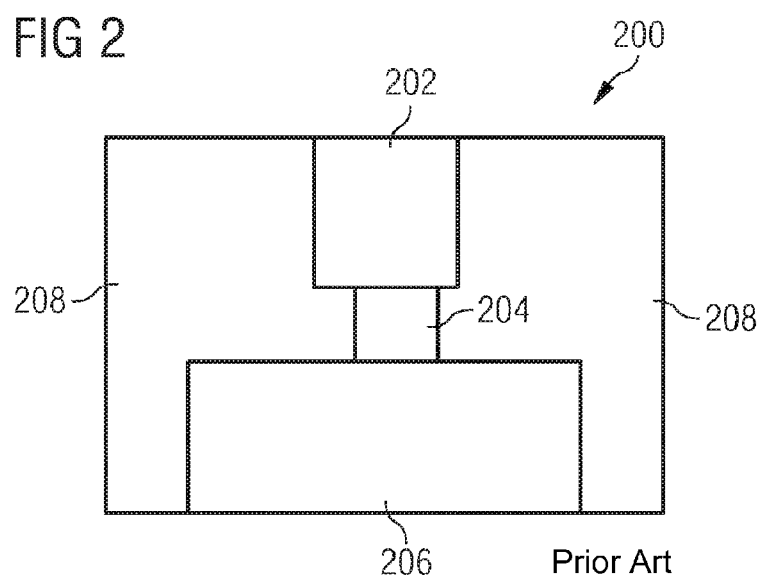
FIG. 2 show a conventional phase changing (PCRAM) memory element.

FIG. 2 illustrates a cross-sectional view of an exemplary phase changing memory element 200 (active-in-via type). The phase changing memory element 200 includes a first electrode 202, a phase changing material 204, a second electrode 206, and an insulating material 208. The phase changing material 204 is laterally enclosed by the insulating material 208. To use the phase changing memory element in a memory cell, a selection device (not shown), such as a transistor, a diode, or another active device, may be coupled to the first electrode 202 or to the second electrode 206 to control the application of a current or a voltage to the phase changing material 204 via the first electrode 202 and/or the second electrode 206. To set the phase changing material 204 to the crystalline state, a current pulse and/or voltage pulse may be applied to the phase changing material 204, wherein the pulse parameters are chosen such that the phase changing material 204 is heated above its crystallization temperature, while keeping the temperature below the melting temperature of the phase changing material 204. To set the phase changing material 204 to the amorphous state, a current pulse and/or voltage pulse may be applied to the phase changing material 204, wherein the pulse parameters are chosen such that the phase changing material 204 is quickly heated above its melting temperature, and is quickly cooled.

The phase changing material 204 may include a variety of materials. According to one embodiment, the phase changing material 204 may include or consist of a chalcogenide alloy that includes one or more elements from group VI of the periodic table. According to another embodiment, the phase changing material 204 may include or consist of a chalcogenide compound material, such as GeSbTe, SbTe, GeTe or AgInSbTe. According to a further embodiment, the phase changing material 204 may include or consist of chalcogen free material, such as GeSb, GaSb, InSb, or GeGaInSb. According to still another embodiment, the phase changing material 204 may include or consist of any suitable material including one or more of the elements Ge, Sb, Te, Ga, Bi, Pb, Sn, Si, P, O, As, In, Se, and S.

According to one embodiment, at least one of the first electrode 202 and the second electrode 206 may include or consist of Ti, V, Cr, Zr, Nb, Mo, Hf, Ta, W, or mixtures or alloys thereof. According to another embodiment, at least one of the first electrode 202 and the second electrode 206 may include or consist of Ti, V, Cr, Zr, Nb, Mo, Hf, Ta, W and two or more elements selected from the group consisting of B, C, N, O, Al, Si, P, S, and/or mixtures and alloys thereof. Examples of such materials include TiCN, TiAlN, TiSiN, W—$Al_2O_3$ and Cr—$Al_2O_3$.

FIG. 3 illustrates a block diagram of a memory device 300 including a write pulse generator 302, a distribution circuit 304, phase changing memory elements 306a-306d, collectively 306 (for example phase changing memory elements 200 as shown in FIG. 2), and a sense amplifier 308. According to one embodiment, the write pulse generator 302 generates current pulses or voltage pulses that are supplied to the phase changing memory elements 306 via the distribution circuit 304, thereby programming the memory states of the phase changing memory elements 306. According to one embodiment, the distribution circuit 304 includes a plurality of transistors that supply direct current pulses or direct voltage pulses to the phase changing memory elements 306 or to heaters (not shown) disposed adjacent to the phase changing memory elements 306.

As already indicated, the phase changing material of the phase changing memory elements 306 may be changed from the amorphous state to the crystalline state (or vice versa) under the influence of a temperature change. More generally, the phase changing material may be changed from a first degree of crystallization to a second degree of crystallization (or vice versa) under the influence of a temperature change.

For example, a bit value "0" may be assigned to the first (low) degree of crystallization, and a bit value "1" may be assigned to the second (high) degree of crystallization. Since different degrees of crystallization imply different electrical resistances, the sense amplifier 308 is capable of determining the memory state of one of the phase changing memory elements 306 in dependence on the resistance of the phase changing material.

To achieve high memory densities, the phase changing memory elements 306 may be capable of storing multiple bits of data, i.e. the phase changing material may be programmed to more than two resistance values. For example, if a phase changing memory element 306 is programmed to one of three possible resistance levels, 1.5 bits of data per memory element can be stored. If the phase changing memory element is programmed to one of four possible resistance levels, two bits of data per memory element can be stored, and so on.

The embodiment shown in FIG. 3 may also be applied in a similar manner to other types of resistivity changing memory elements like programmable metallization cells (PMCs), magnetoresistive memory elements (e.g., MRAMs) or organic memory elements (e.g., ORAMs).

Another type of resistivity changing memory element may be formed using carbon as a resistivity changing material. Generally, amorphous carbon that is rich is $sp^3$-hybridized carbon (i.e., tetrahedrally bonded carbon) has a high resistivity, while amorphous carbon that is rich in $sp^2$-hybridized carbon (i.e., trigonally bonded carbon) has a low resistivity. This difference in resistivity can be used in a resistivity changing memory cell.

In one embodiment, a carbon memory element may be formed in a manner similar to that described above with reference to phase changing memory elements. A temperature-induced change between an $sp^3$-rich state and an $sp^2$-rich state may be used to change the resistivity of an amorphous carbon material. These differing resistivities may be used to represent different memory states. For example, a high resistance $sp^3$-rich state can be used to represent a "0", and a low resistance $sp^2$-rich state can be used to represent a "1". It will be understood that intermediate resistance states may be used to represent multiple bits, as discussed above.

Generally, in this type of carbon memory element, application of a first temperature causes a change of high resistivity $sp^3$-rich amorphous carbon to relatively low resistivity $sp^2$-rich amorphous carbon. This conversion can be reversed by application of a second temperature, which is typically higher than the first temperature. As discussed above, these temperatures may be provided, for example, by applying a current and/or voltage pulse to the carbon material. Alternatively, the temperatures can be provided by using a resistive heater that is disposed adjacent to the carbon material.

Another way in which resistivity changes in amorphous carbon can be used to store information is by field-strength induced growth of a conductive path in an insulating amorphous carbon film. For example, applying voltage or current pulses may cause the formation of a conductive $sp^2$ filament in insulating $sp^3$-rich amorphous carbon. The operation of this type of resistive carbon memory is illustrated in FIGS. 4A and 4B.

FIG. 4A shows a carbon memory element 400 that includes a top contact 402, a carbon storage layer 404 including an insulating amorphous carbon material rich in $sp^3$-hybridized carbon atoms, and a bottom contact 406. As shown in FIG. 4B, by forcing a current (or voltage) through the carbon storage layer 404, an $sp^2$ filament 450 can be formed in the $sp^3$-rich carbon storage layer 404, changing the resistivity of the memory element. Application of a current (or voltage) pulse with higher energy (or, in some embodiments, reversed polarity) may destroy the $sp^2$ filament 450, increasing the resistance of the carbon storage layer 404. As discussed above, these changes in the resistance of the carbon storage layer 404 can be used to store information, with, for example, a high resistance state representing a "0" and a low resistance state representing a "1". Additionally, in some embodiments, intermediate degrees of filament formation or formation of multiple filaments in the $sp^3$-rich carbon film may be used to provide multiple varying resistivity levels, which may be used to represent multiple bits of information in a carbon memory element. In some embodiments, alternating layers of $sp^3$-rich carbon and $sp^2$-rich carbon may be used to enhance the formation of conductive filaments through the $sp^3$-rich layers, reducing the current and/or voltage that may be used to write a value to this type of carbon memory. Similar methods of forming a conductive path through an insulating material are used, for example, in conductive bridging (CBRAM) memory devices and in transition metal oxide (TMO) memory devices.

Figure 5A:
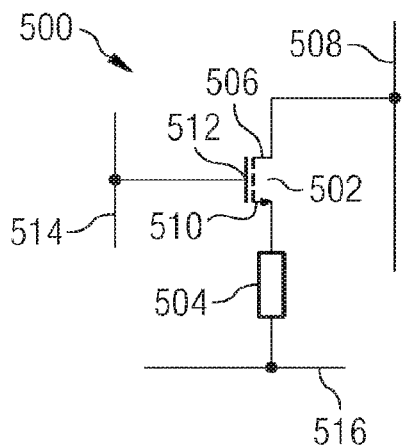
FIGS. 5A and 5B show schematic representations of a memory cell including a resistivity changing memory element and a select transistor.

Resistivity changing memory elements, such as the phase changing memory elements, carbon memory elements, magnetoresistive memory elements, and other resistivity changing memory elements discussed above may be used as part of a memory cell, along with a transistor, diode, or other active component for selecting the memory cell. FIG. 5A shows a schematic representation of such a memory cell that uses a resistivity changing memory element. The memory cell 500 includes a select transistor 502 and a resistivity changing memory element 504. The select transistor 502 includes a source 506 that is connected to a bit line 508, a drain 510 that is connected to the memory element 504, and a gate 512 that is connected to a word line 514. The resistivity changing memory element 504 also is connected to a common line 516, which may be connected to ground, or to other circuitry, such as circuitry (not shown) for determining the resistance of the memory cell 500, for use in reading. Alternatively, in some configurations, circuitry (not shown) for determining the state of the memory cell 500 during reading may be connected to the bit line 508. It should be noted that as used herein the terms connected and coupled are intended to include both direct and indirect connection and coupling, respectively.

To write to the memory cell 500, the word line 514 is used to select the memory cell 500, and a current (or voltage) pulse on the bit line 508 is applied to the resistivity changing memory element 504, changing the resistance of the resistivity changing memory element 504. Similarly, when reading the memory cell 500, the word line 514 is used to select the cell 500, and the bit line 508 is used to apply a reading voltage (or current) across the resistivity changing memory element 504 to determine the resistance of the resistivity changing memory element 504.

Figure 5B:
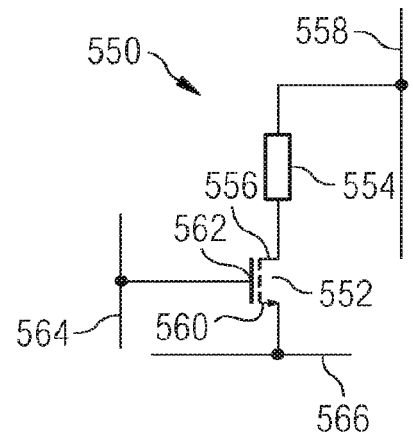

The memory cell 500 may be referred to as a 1T1J cell, because it uses one transistor, and one memory "junction" (the resistivity changing memory element 504). Typically, a memory device will include an array of many such cells. It will be understood that other configurations for a 1T1J memory cell, or configurations other than a 1T1J configuration may be used with a resistivity changing memory element. For example, in FIG. 5B, an alternative arrangement for a 1T1J memory cell 550 is shown, in which a select transistor 552 and a resistivity changing memory element 554 have been repositioned with respect to the configuration shown in FIG. 5A. In this alternative configuration, the resistivity changing memory element 554 is connected to a bit line 558, and to a source 556 of the select transistor 552. A drain 560 of the select transistor 552 is connected to a common line 566, which may be connected to ground, or to other circuitry (not shown), as discussed above. A gate 562 of the select transistor 552 is controlled by a word line 564. It will further be understood that although transistors will be described as having particular "source" and "drain" regions, the source and drain regions may be reversed (i.e., "source" regions being replaced with "drain" regions and "drain" regions being replaced with "source" regions) without substantially altering the principles of the various embodiments of the invention.

While the memory device described below will be discussed with reference to a thermal select MRAM device, it will be understood that the apparatus and methods described herein could be used with other memory devices, including other types of resistivity changing memory elements such as those discussed above, including PCRAM, carbon memory, other types of MRAM (e.g., spin injection MRAM), and CBRAM memory elements.

Many of the resistivity changing memory technologies described above use relatively high write currents compared to DRAM and other conventional memory technologies. Such high write currents are used, for example, to heat the phase change material in PCRAM devices, to heat the magnetoresistive memory element in thermal select MRAM devices, or to generate a field sufficient to form a conductive path in a carbon memory device or CBRAM memory device. Such high write currents may have an effect on memory cell size, due to contacts and the amount of current that can be driven by a transistor. Because the amount of current that can be driven is limited by the transistor dimensions, to drive a large write current for a resistivity changing memory device, a relatively large transistor is typically needed.

Generally, as the size of memory cells becomes smaller, the density of cells in a memory device increases. To be competitive with more conventional memories, such as DRAM, it may be desirable to achieve a cell size of less than 10 $F^2$, where F is the minimum feature size. For technology below a 90 nm node size, it may be challenging to achieve a cell size of less than 10 $F^2$, while using a transistor that is able to drive the write current used by a thermal select MRAM or other resistivity changing memory element.

Figure 6:
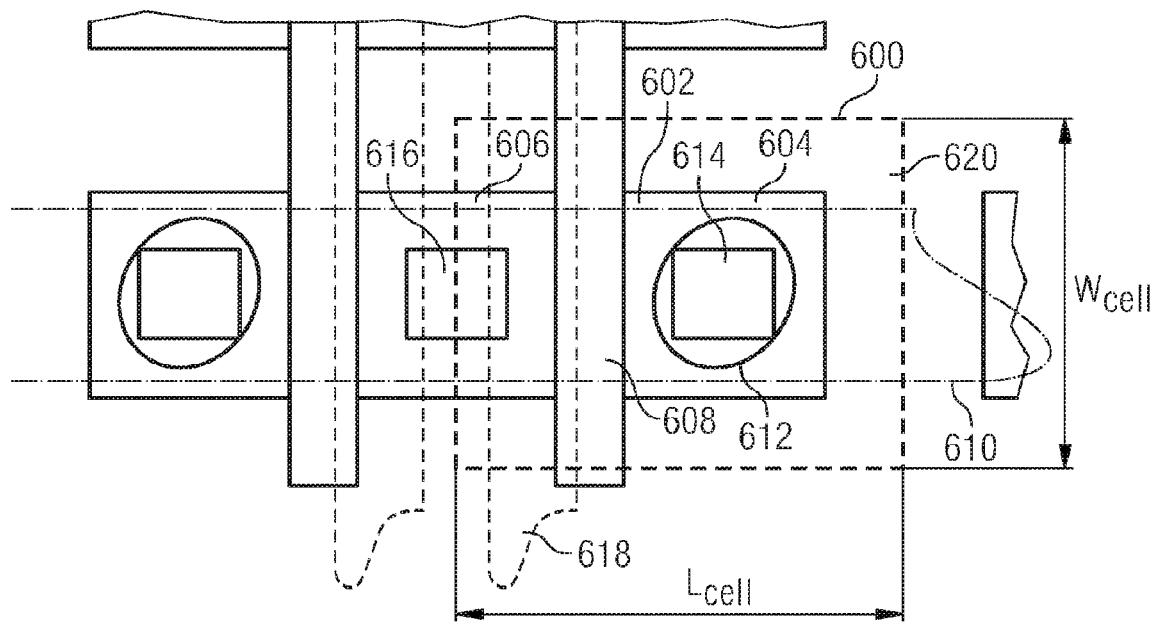
FIG. 6 shows the layout of a conventional thermal select MRAM cell.

This is illustrated in FIG. 6, which shows the layout for a conventional thermal select MRAM cell 600 using a 65 nm CMOS technology. The MRAM cell 600 includes a transistor 602 having a source region 604, a drain region 606, and a gate 608. A bit line 610 is electrically connected to a magnetoresistive memory element 612, which is connected through a via 614 to the source region 604 of the transistor 602. The drain region 606 of the transistor 602 is electrically connected to a ground line through a ground via connection 616. A word line 618 is electrically connected to the gate 608 of the transistor 602, so that a current may flow through the magnetoresistive memory element 612 and the transistor 602 when an activation voltage is applied on the word line 618. An isolation region 620 surrounds the transistor 602, electrically isolating the cell from other adjacent cells.

As can be seen in FIG. 6, cell density is improved by sharing the drain region 606 and ground via connection 616 between the transistors of two adjacent cells. Thus, in measurements of the size of the MRAM cell 600, only half of the size of the drain region 606 and half of the size of the ground via connection 616 are included in the size of the cell 600.

Based on the channel length (i.e., the length of the gate 608 that crosses the area of the transistor 602, in this instance) that is needed to handle a write current of approximately 220 µA for a thermal select MRAM cell, and the sizes of the via contacts to the source region 604 and the drain region 606, the overall width of the memory cell 600, $W_{cell}$, is approximately 300 nm. The length of the cell, $L_{cell}$, is approximately 325 nm. In terms of the minimum feature size, F, of 65 nm, $W_{cell}$ is 4.6 F, and $L_{cell}$ is 5 F. This gives an overall cell area of 23 $F^2$.

Figure 7A:
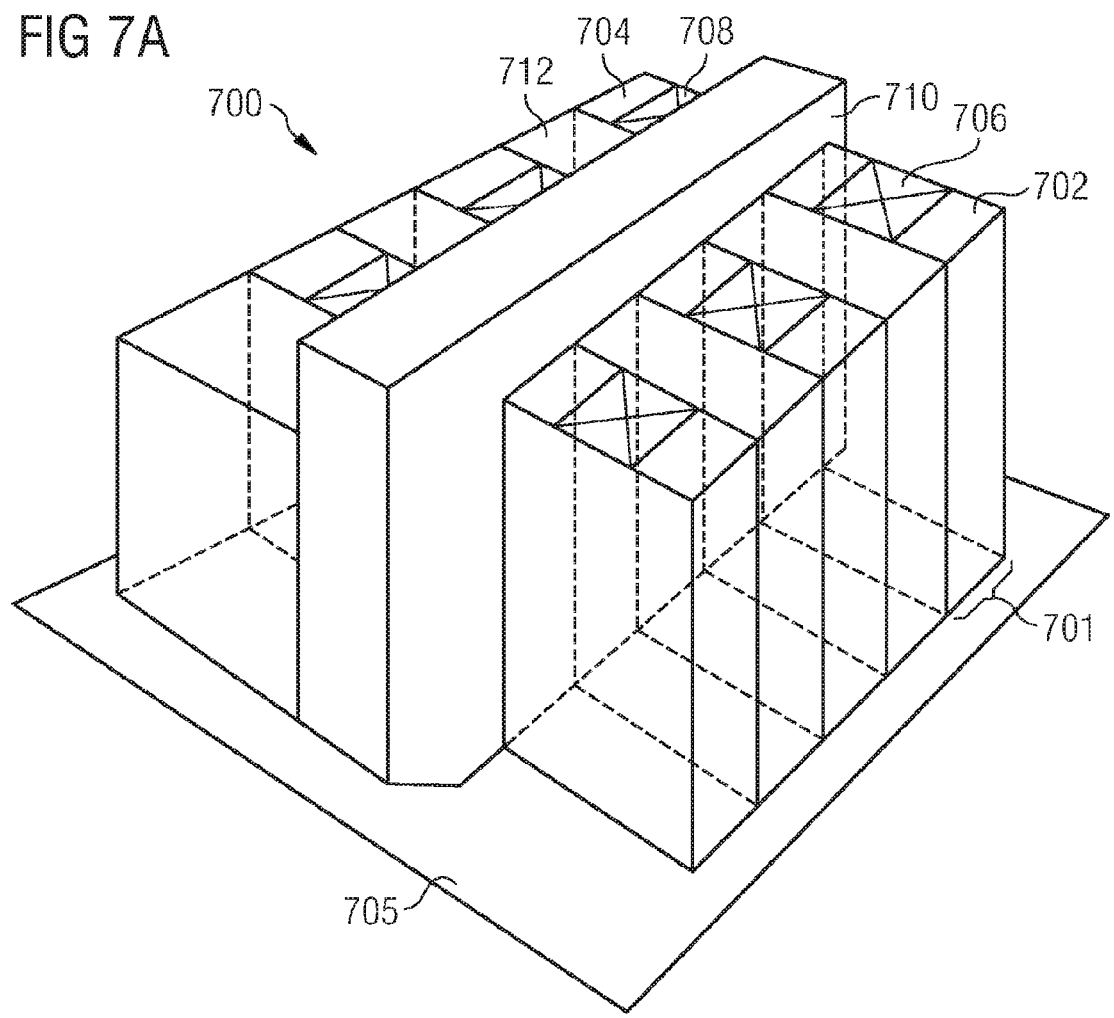
FIGS. 7A and 7B illustrate a FinFET of a type that may be suitable for use with some embodiments of the invention.
Figure 7B:
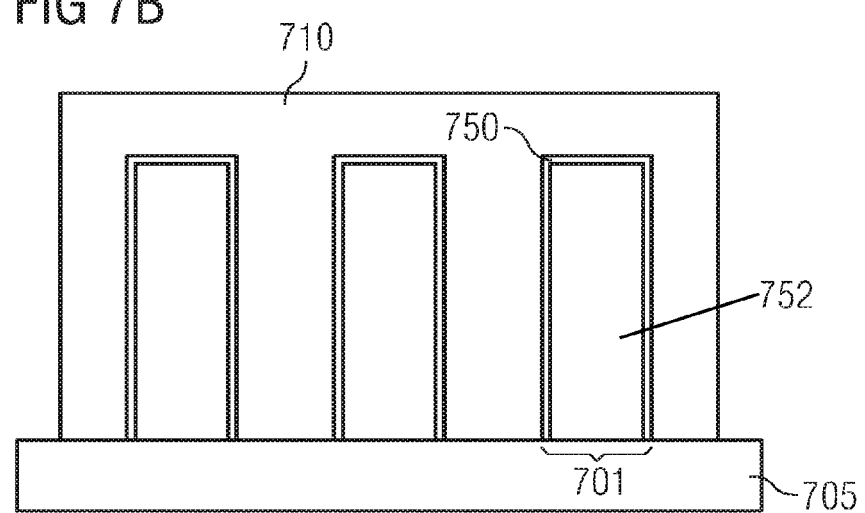

In accordance with an embodiment of the invention, a FinFET, in which the effective channel length of the transistor depends on the height of a "fin" which is surrounded by a dielectric gate oxide layer and gate, rather than the width of the transistor, may be used to drive a relatively high current while achieving a cell size below 10 $F^2$ in a 65 nm node technology. FIGS. 7A-7B illustrate a FinFET of a type that may be suitable for use with some embodiments of the invention. FIG. 7A shows a view of an example FinFET structure 700, including three FinFET transistors. The FinFET structure 700 is formed on a substrate 705. A transistor 701 of the FinFET structure 700 includes a source region 702, with a source contact 706, and a drain region 704, with a drain contact 708. The source region 702 and drain region 704 are separated by a gate 710, which surrounds a "fin" (not shown, since it is hidden by the gate) that extends in a direction substantially parallel to a top surface of the substrate 705, between the source regions 702 and drain regions 704. The transistor channel (not shown) runs through this fin, in a direction substantially parallel to the surface of the substrate 705, so that the effective channel length of the gate is twice the height of the fin, plus the width of the fin. Since the width of the fin is typically small compared to its height, the additional effective channel length due to the width of the fin may be negligible in many embodiments. An isolation region 712, which is filled with an interlayer dielectric (ILD) material or other suitable electrically insulating material, separates the transistor 701 from adjacent transistors.

FIG. 7B shows a cross-section through the gate 710 of the FinFET structure 700 shown in FIG. 7A. As can be seen, the gate 710 surrounds a dielectric gate oxide layer 750 of the transistor 701. The gate oxide layer 750 surround three sides of a channel portion of a fin 752 that extends between the source region (not shown) from the drain region (not shown). As discussed above, the effective channel length for such a FinFET is related to the height of the fin 752. The FinFET structure 700 is formed on the substrate 705.

Figure 8A:
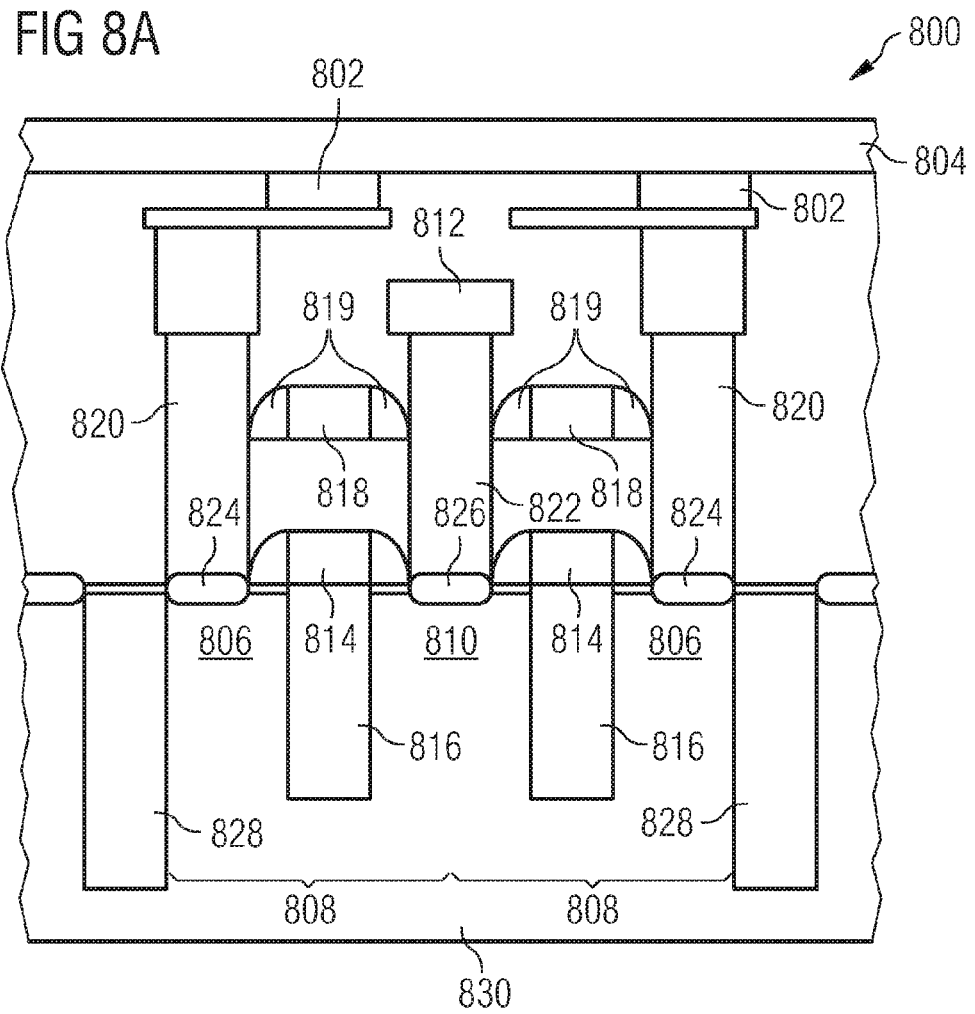
Figure 8B:
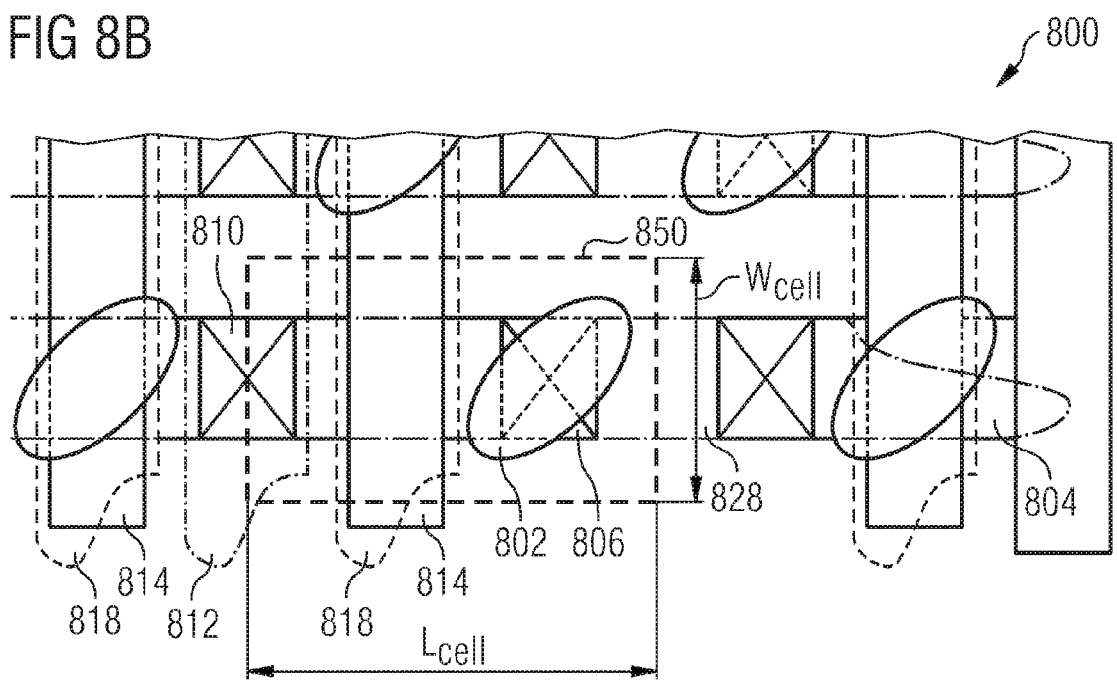

FIGS. 8A-C illustrate an example integrated circuit memory device according to an embodiment of the invention. FIG. 8A shows a cross section of an integrated circuit resistivity changing memory device 800 (in this embodiment, a thermal select MRAM device) constructed using FinFETs. The memory device 800 includes magnetoresistive memory elements 802, connected (through source vias 820 and source contacts 824) between bit line 804 and source regions 806 of FinFETs 808. It should be noted that the asymmetric arrangement of the magnetoresistive memory elements 802 shown in FIG. 8A is intended to provide separation between adjacent magnetoresistive memory elements 802, to avoid magnetic interference between them. Such an asymmetric arrangement may not be present in some embodiments, and may have substantially no effect in embodiments that use other types of resistivity changing memory elements, such as phase changing memory elements or carbon memory elements.

A drain region 810 is shared by adjacent FinFETs, and is electrically connected (through a drain contact 826 and drain via 822) to a common line 812, which may be connected to ground. Gates 814 also serve as word lines, and surround gate oxide layers 816 of the FinFETs 808, such as is described above, with reference to FIG. 7. It should be noted that in some embodiments, additional lines 818, including spacers 819 are used for aligning source vias 820 and drain via 822. Adjacent pairs of FinFETs are separated by isolation regions 828 in a substrate 830.

FIG. 8B shows a layout of memory cells in the integrated circuit memory device 800, in accordance with an embodiment of the invention. As can be seen, the area of a cell 850 includes half of the area of the shared drain region 810, the area of the source region 806, the width of the gate 814, and half of the area of the isolation region 828 that separates the cell 850 from adjacent pairs of cells.

Because the embodiment shown in FIGS. 8A-8C uses a FinFET, in which the effective channel length depends on the height of the fin, rather than the width of the cell, the width of the cell can be reduced as compared to (for example) the width of the conventional cell layout described above with reference to FIG. 6. For example, to drive a current in the range of approximately 226 μA to approximately 271 μA, for writing to a thermal select MRAM, the fin height should be in the range of approximately 240 to 314 nm. However, the length of the gate crossing the active area of the transistor is no longer limiting on the current that the transistor can drive, so the width of the cell may depend on other factors, such as the contact width and minimum feature size. Accordingly, the width of the cell shown in FIG. 8B, $W_{cell}$, may be approximately 130 nm, while the length of the cell, $L_{cell}$, may be approximately 218 nm. With a node size of 65 nm, this means that the cell has a width of approximately 2 F, and a length of approximately 3.34 F, giving an area of approximately 6.68 $F^2$—well below the 10 $F^2$ area that is needed to be competitive with many other memory technologies, such as DRAM.

Referring now to FIG. 8C, a three-dimensional view of the integrated circuit memory device 800 is shown, including both front-end-of-line (FEOL) structures, such as the gates 814 gate oxide layers 816, and back-end-of-line (BEOL) structures, such as bit lines 804 and magnetoresistive memory elements 802. In this view, the area of a single cell 870 is outlined, and gate oxide layers 816 are shown surrounding channel portions of fin structures 872.

Figure 9A:
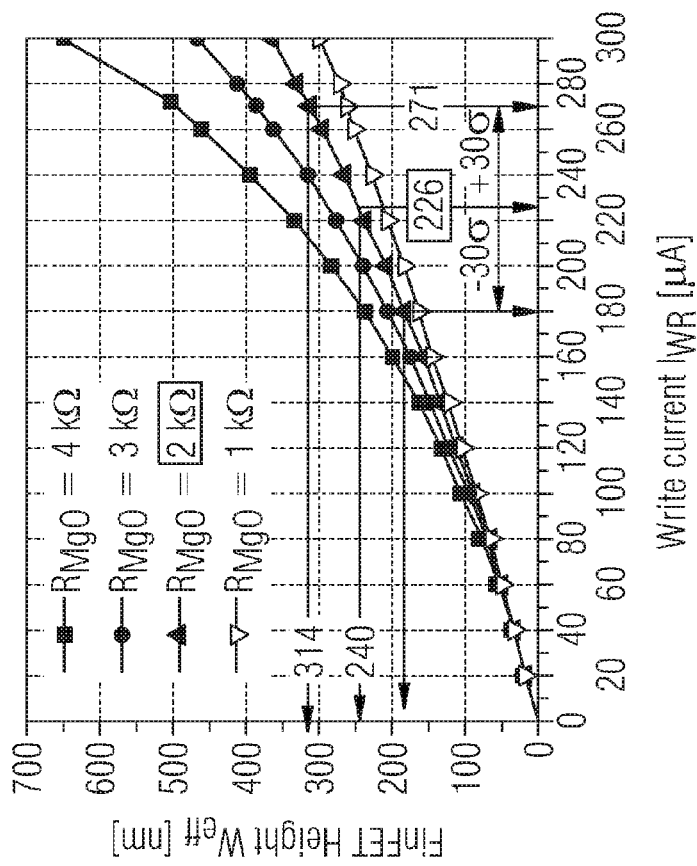
FIGS. 9A and 9B are graphs of estimated FinFET height vs. write current, in accordance with an embodiment of the invention.

FIG. 9A shows a graph of estimated FinFET height ($W_{eff}$) in nm, against the write current in μA. As can be seen, assuming that the magnetoresistive memory element has a resistance of approximately 1 kΩ, and a write current of approximately 220 μA, the estimated FinFET height would be approximately 350 nm.

Figure 9B:
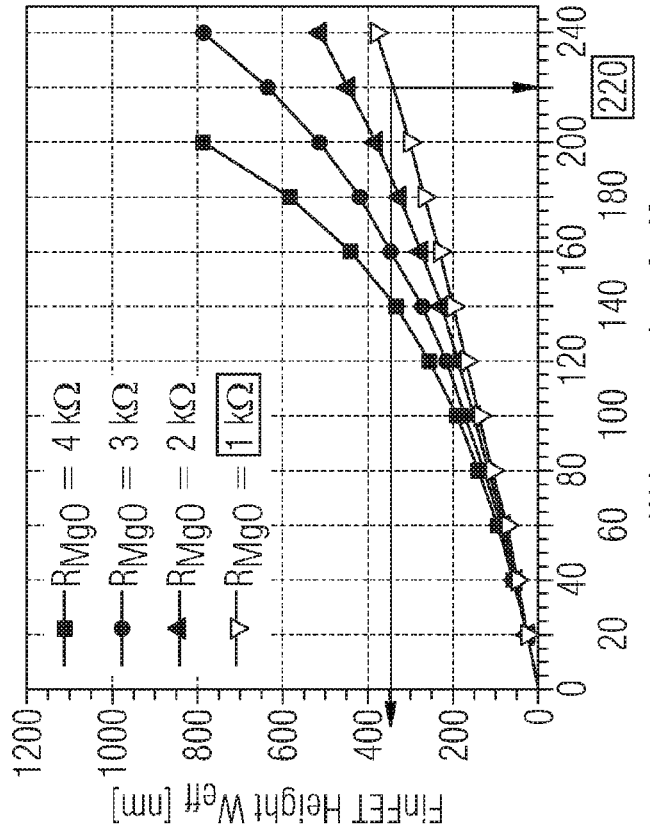

FIG. 9B shows a similar graph, assuming overdrive of the FinFET. Under overdrive conditions, the gate and source/drain voltages are higher than those assumed in FIG. 9A, allowing a higher write current for the FinFET. As can be seen, for a magnetoresistive memory element having a resistance of approximately 2 kΩ, and a write current of approximately 226 μA, a height of approximately 240 nm may be used. For a write current in the range of approximately 226 μA to approximately 271 μA, a FinFET height of approximately 240 nm to approximately 314 nm may be used in some embodiments.

FIGS. 10A-10L show steps in the FEOL process for manufacturing an integrated circuit including a FinFET structure for use with a resistivity changing memory cell, such as is described above, in accordance with an embodiment of the invention. In this embodiment, the FinFET is formed on a silicon-on-insulator (SOI) substrate. Such a process may provide a relatively high fin, permitting a relatively high drive current. Additionally, forming the cell structure on SOI may provide effects such as a reduced capacitance for AC performance, facilitation of bidirectional bias, and a somewhat simplified process compared to, for example, formation of the FinFET on a bulk silicon substrate. However, forming the FinFET on SOI also may lead to floating body effects in some embodiments.

Figure 10A:
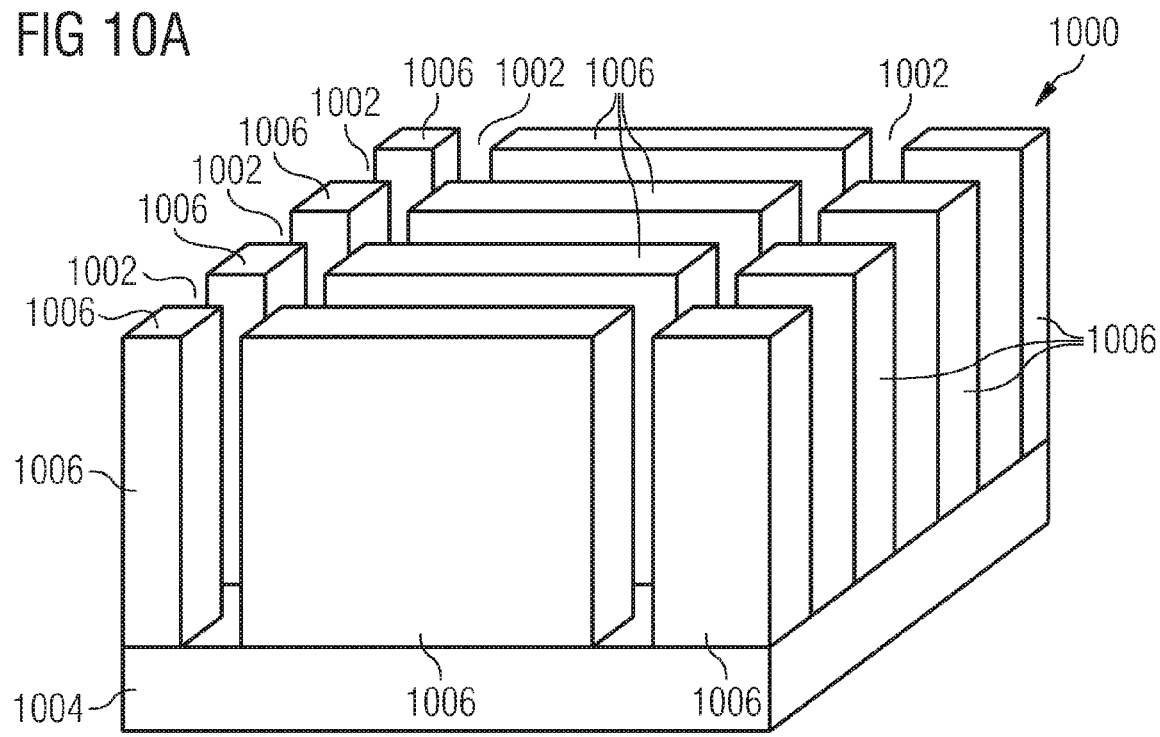
FIGS. 10A-10L show various steps in a front-end-of-line (FEOL) process for manufacturing an integrated circuit memory device according to an embodiment of the invention.

FIG. 10A shows a first step in an example embodiment of an FEOL process of forming an integrated circuit including a resistivity changing memory device 1000 using FinFETs. As shown in FIG. 10A, trenches 1002 are formed in a silicon layer disposed above a buried oxide layer 1004, to form elongated structures 1006. It will be understood that the patterning and etching of the trenches 1002 in the silicon layer may be carried out using conventional lithographic and/or etching techniques.

Next, deep channel doping/counter doping are used to establish either p-type or n-type conductivity in the elongated structures 1006. Conventional doping techniques, such as ion implantation, using convention dopants, such as boron for p-type conductivity, or phosphorus, arsenic, and/or antimony for n-type conductivity, may be used, though use of other known or later discovered doping techniques and/or dopant materials also is possible.

Figure 10B:
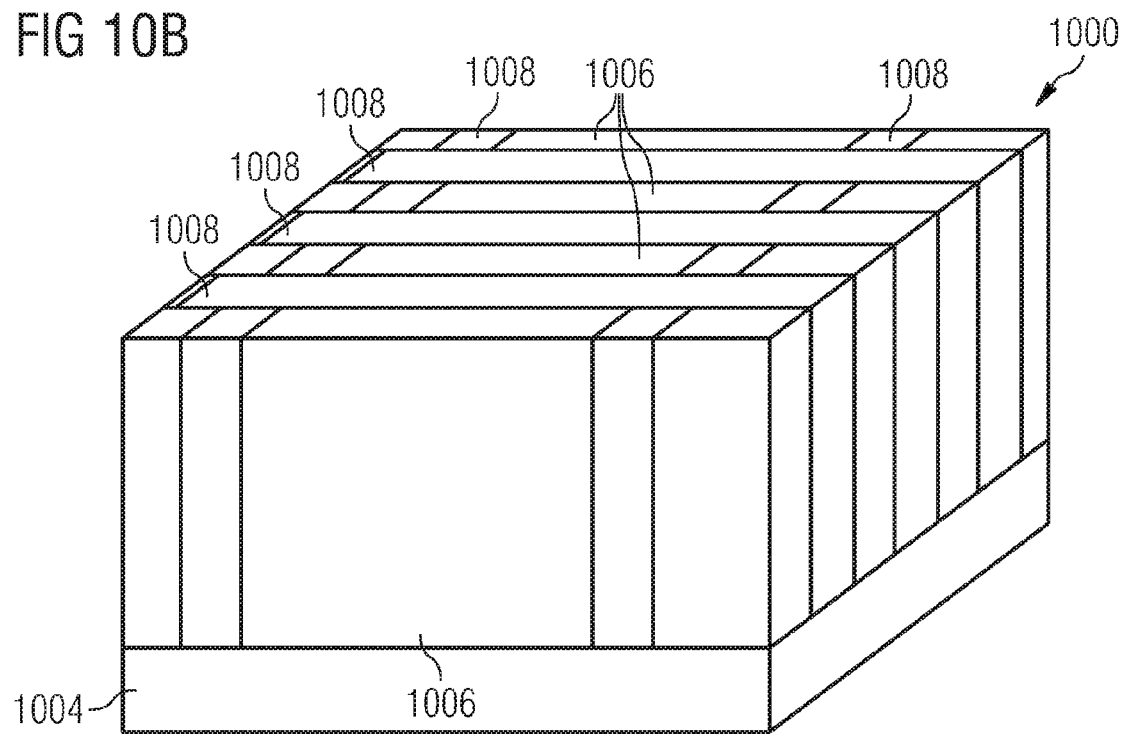

FIG. 10B shows the results of the next step, in which the trenches are filled with an oxide material 1008 to form isolation structures separating the elongated structures 1006. The oxide material may be applied using conventional deposition techniques. The oxide material 1008 is then planarized, using, for example, chemical-mechanical planarization (CMP) techniques.

Figure 10C:
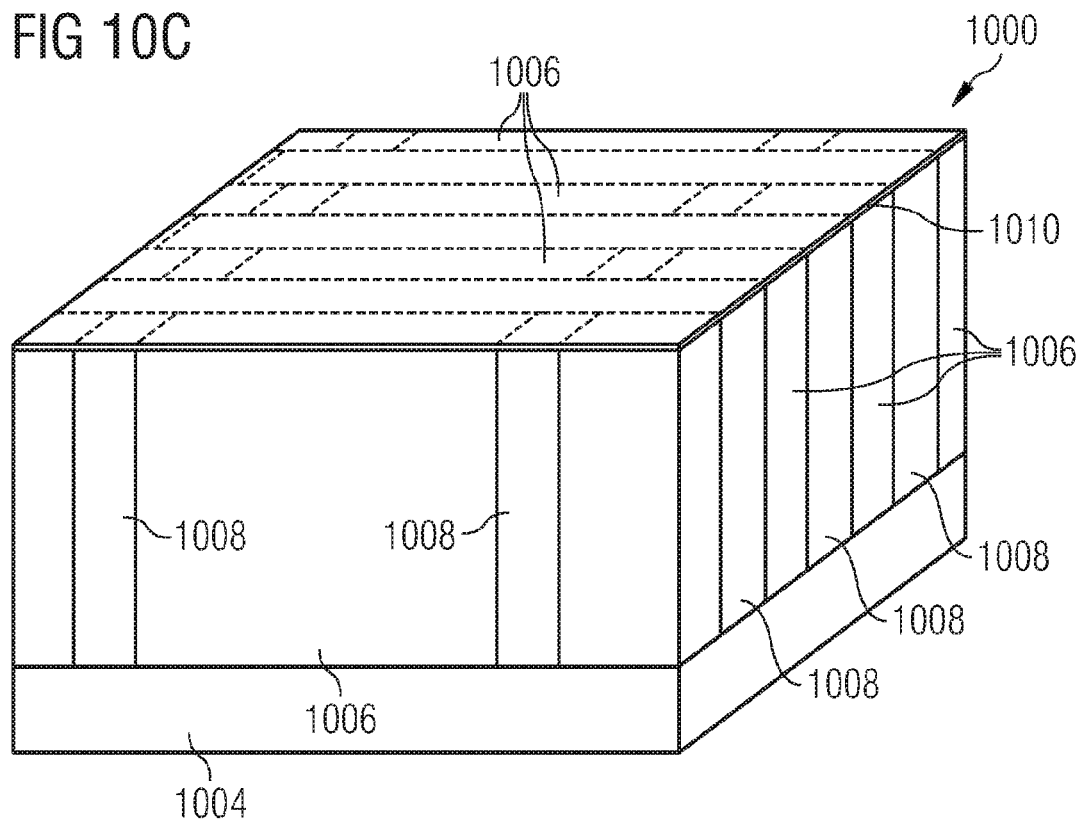
Figure 10D:
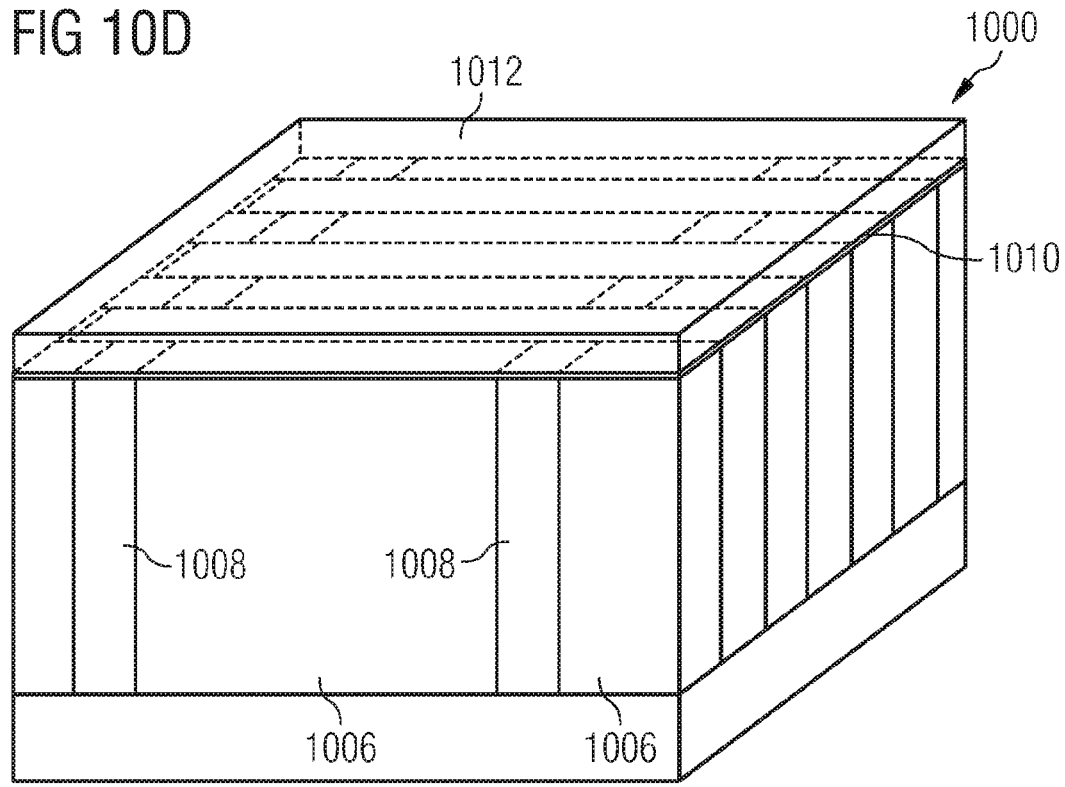

Next, as shown in FIG. 10C, a top pad oxide layer 1010 is formed. The top pad oxide layer may be formed by a conventional oxidation technique. A nitride layer 1012 may then be deposited, as shown in FIG. 10D.

Figure 10E:
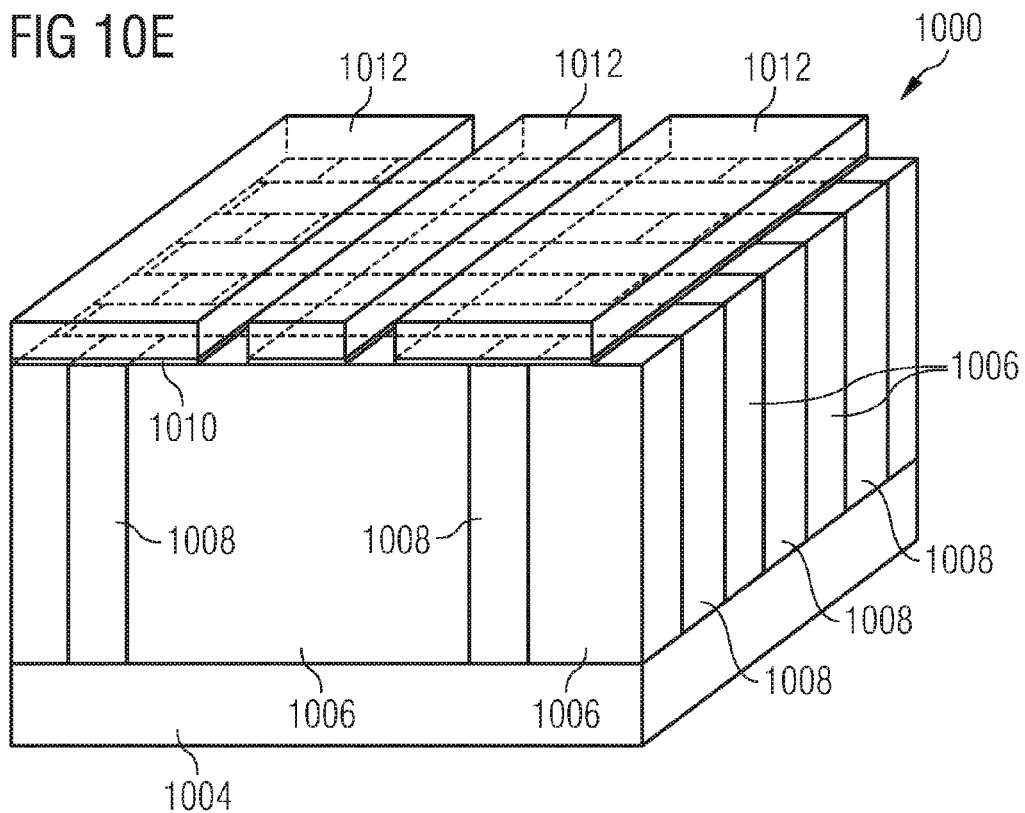

FIG. 10E shows the results of the next step, in which the nitride layer 1012 is etched according to a gate pattern, to expose portions of the device 1000 in which a gate will be formed. This patterning and etching may be performed, for example, using conventional lithography and etching techniques.

Figure 10F:
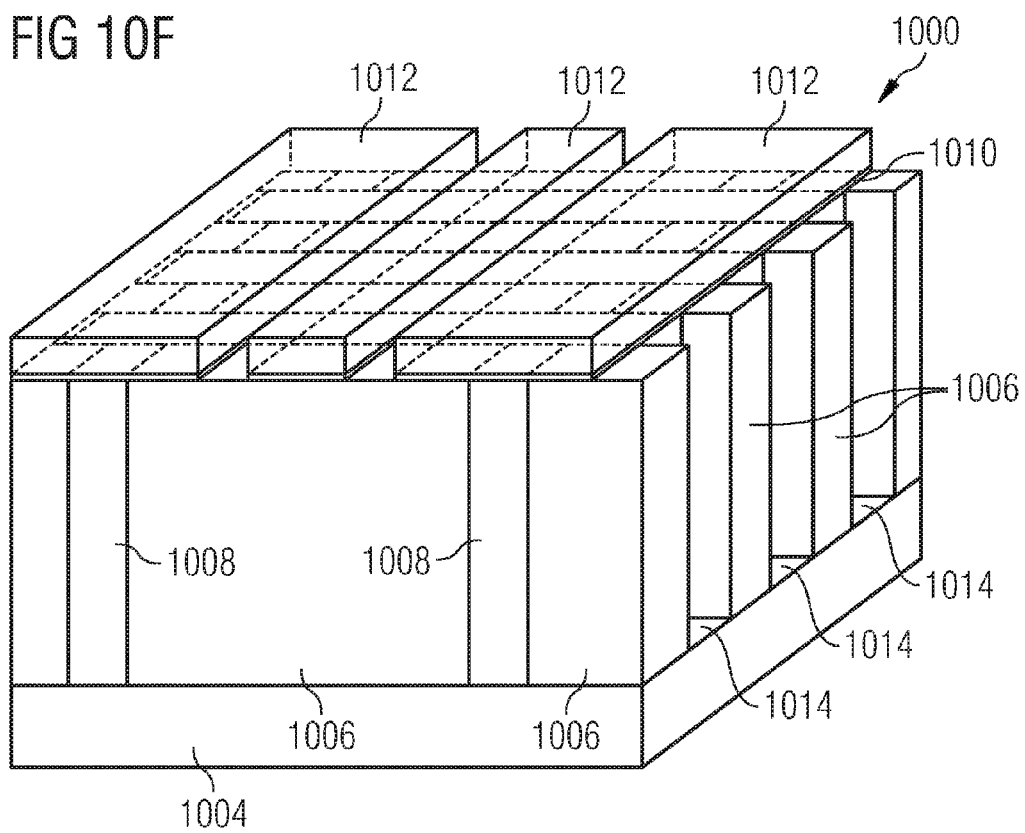

In FIG. 10F, the oxide has been etched from the gate pattern areas, where the nitride was removed in the previous step. This results in the formation of trenches 1014, adjacent to the elongated structures 1006.

Figure 10G:
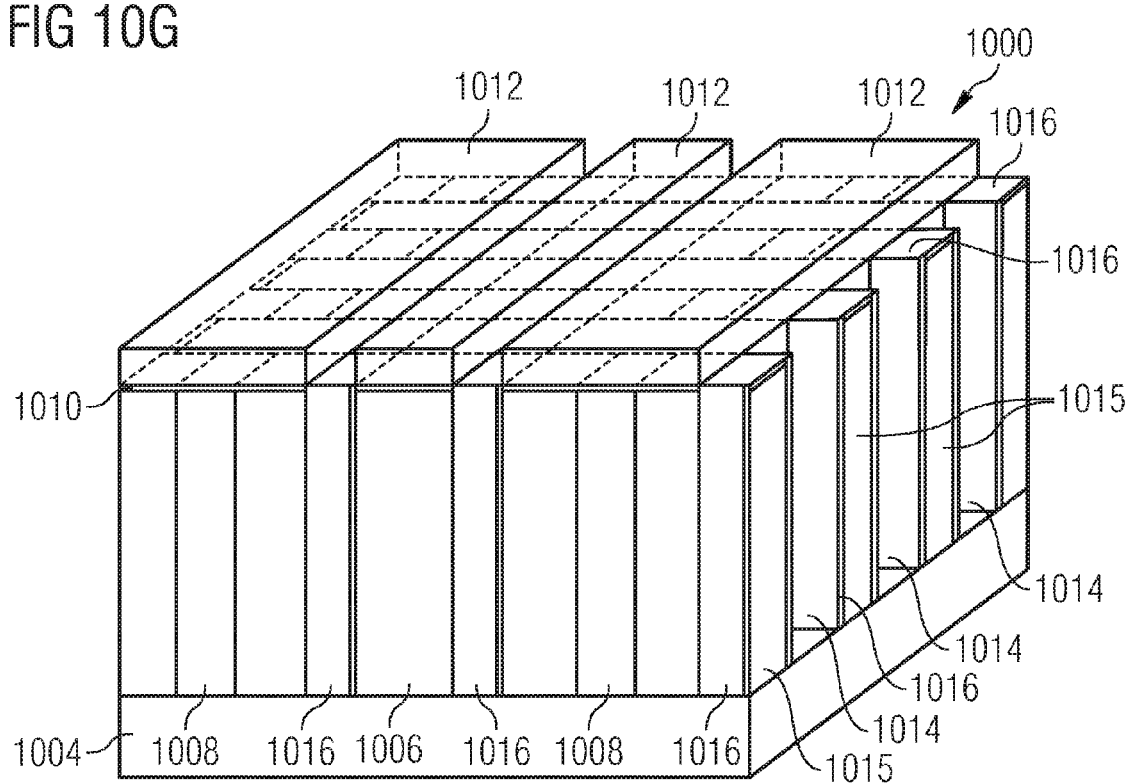

FIG. 10G shows the results of the next step, in which gate oxides 1016 have been formed around fin structures 1015 of the elongated structures 1006 in the areas of the gate patterns to form the channels for the transistors. The gate oxides 1016 may be formed by conventional oxidation techniques.

Figure 10H:
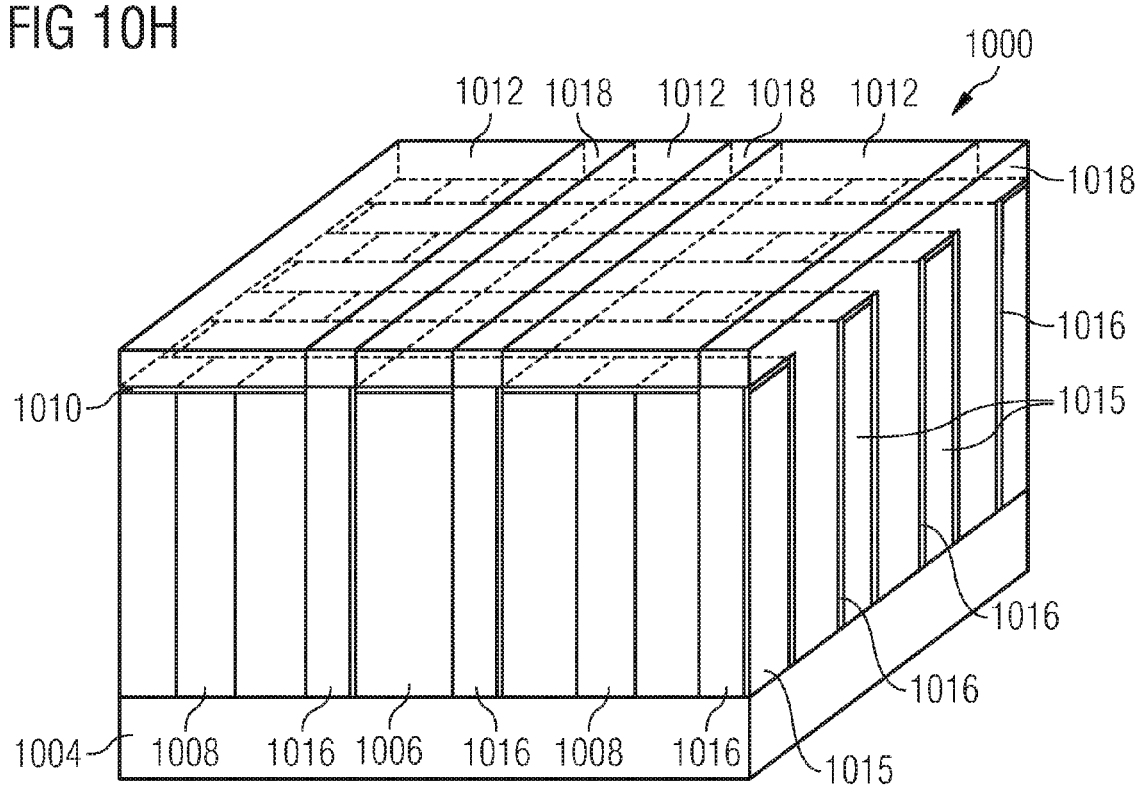

Next, as shown in FIG. 10H, the areas of the gate patterns are filled with a conductive gate material, such as doped polysilicon. Filling these areas forms gate structures 1018 that surround the fin structures 1015 and gate oxides 1016, to complete formation of the gates for the FinFETs. Conventional deposition techniques may be used to deposit the gate material. Following deposition of the material, CMP techniques may be used to planarize the gate structures 1018. As discussed above, the gate structures 1018 also serve as word lines for selecting particular memory cells for reading or writing.

Figure 10I:
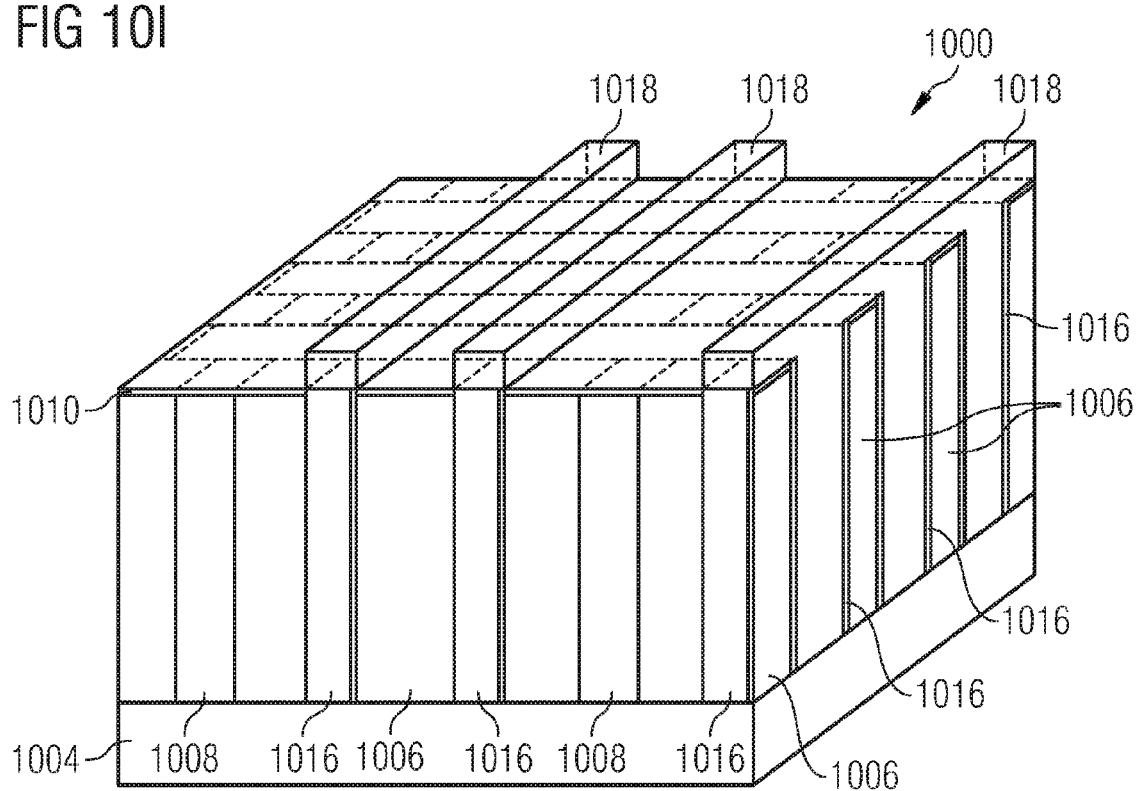

FIG. 10I shows the results of the next step, in which the nitride layer 1012 has been removed. This may be accomplished, for example, using conventional etching techniques.

Figure 10J:
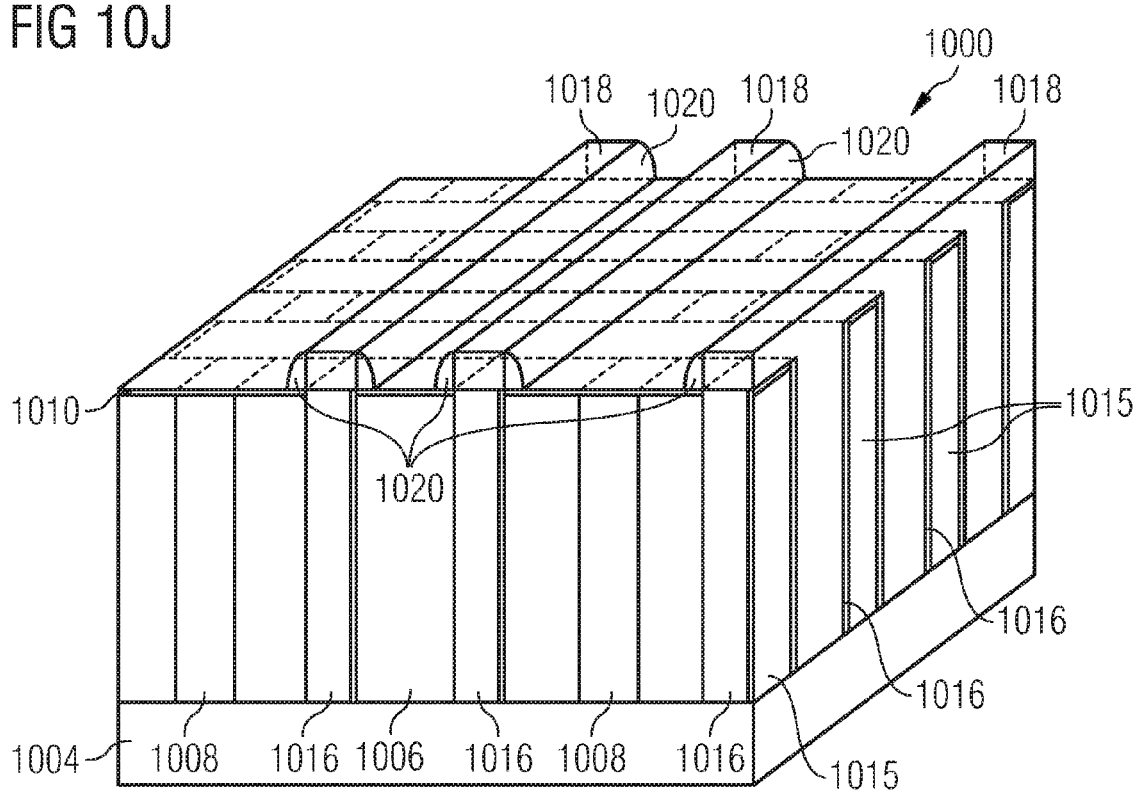

As shown in FIG. 10J, sidewall spacers 1020 are formed around a portion of the gate structures 1018. The sidewall spacers 1020 are formed using conventional semiconductor processing techniques. For example, in some embodiments, the sidewall spacers 1020 may be formed by depositing an insulating material such as an oxide, nitride or oxynitride of silicon, and then using anisotropic etching to form the sidewall spacers 1020 from the deposited material. The sidewall spacers 1020 may be used in some embodiments for aligning contacts (not shown) and vias (not shown).

Figure 10K:
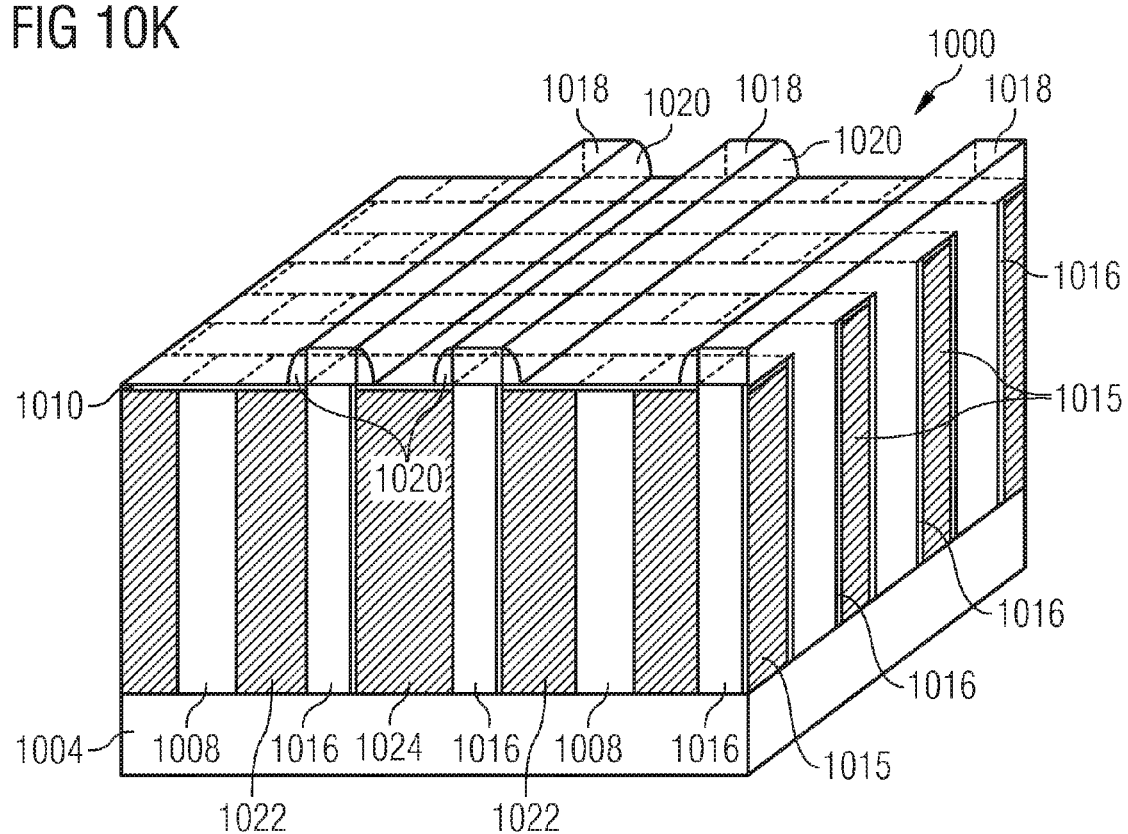

Next, as shown in FIG. 10K, the source regions 1022 and drain regions 1024 are doped for either n-type or p-type conductivity. If the fin structures 1015 are doped for n-type conductivity, then the source regions 1022 and drain regions 1024 may be doped for p-type conductivity. If the fin structures 1015 are doped for p-type conductivity, then the source regions 1022 and drain regions 1024 may be doped for n-type conductivity. The doping of the source regions 1022 and drain regions 1024 may be carried out using conventional doping techniques, such as ion implantation, using convention dopants, such as boron for p-type conductivity, or phosphorus, arsenic, and/or antimony for n-type conductivity, though other appropriate dopant materials may be used.

Figure 10L:
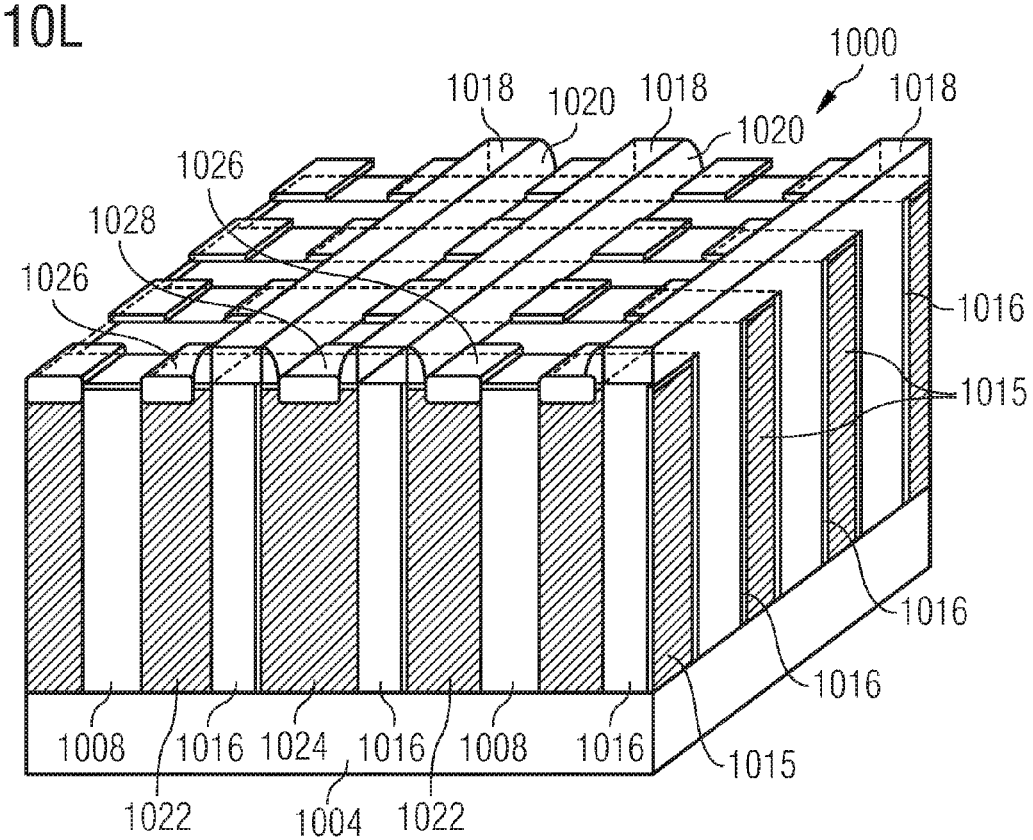

Next, in the step shown in FIG. 10L, salicidation is used to form source contacts 1026 and drain contacts 1028. This generally involves depositing a metal over the areas of silicon where the contacts are to be formed, and then reacting the metal with the silicon to form a silicide at a high temperature, during an anneal or sinter process. Of course, other salicidation methods or methods of forming contacts for the FinFETs also may be used.

Once the contacts have been formed, the FEOL process is complete, and the FinFETs for use with a resistivity changing memory device have been formed. A BEOL process, in which vias, metal bit lines and common lines, and the magnetoresistive memory elements are fabricated may be used to complete the memory device. Such a BEOL process, in accordance with another embodiment of the invention, will be described in greater detail below.

Another embodiment of the invention is illustrated in FIGS. 11A-11M, which show steps in the FEOL process for manufacturing a FinFET structure for use with a resistivity changing memory cell on bulk silicon, rather than on SOI. This embodiment may provide compatibility with other bulk technologies for memory chips. However, use of bulk silicon may involve a slightly more complex process, including two-step etches that may limit the achievable fin height in a FinFET. In some embodiments, a device produced on bulk silicon may have somewhat higher junction capacitance and overlap capacitance due to bidirectional bias.

Figure 11A:
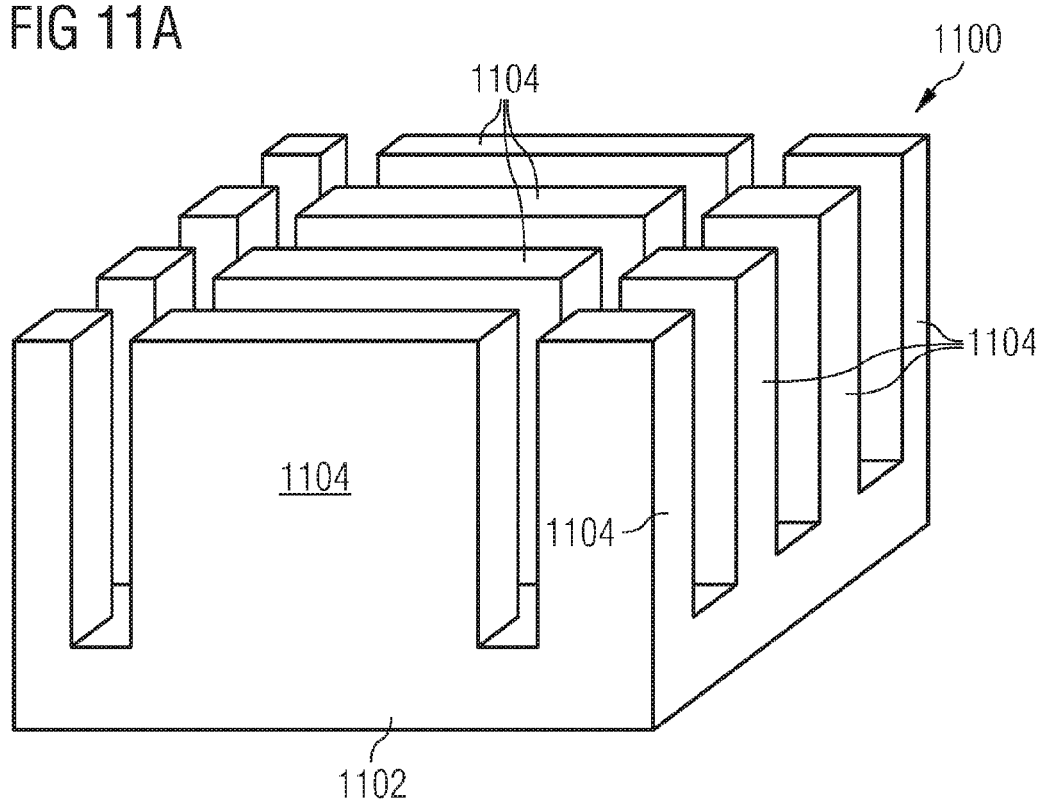
FIGS. 11A-11M show steps in a FEOL process for manufacturing an integrated circuit memory device according to another embodiment of the invention.

In FIG. 11A a first step in an embodiment of an FEOL process of forming a resistivity changing memory device 1100 using FinFETs is shown. In this step, trenches are formed in a bulk silicon layer 1102 to form elongated structures 1104. The patterning and etching of the trenches in the silicon layer 1102 may be carried out using conventional lithographic and/or etching techniques.

Figure 11B:
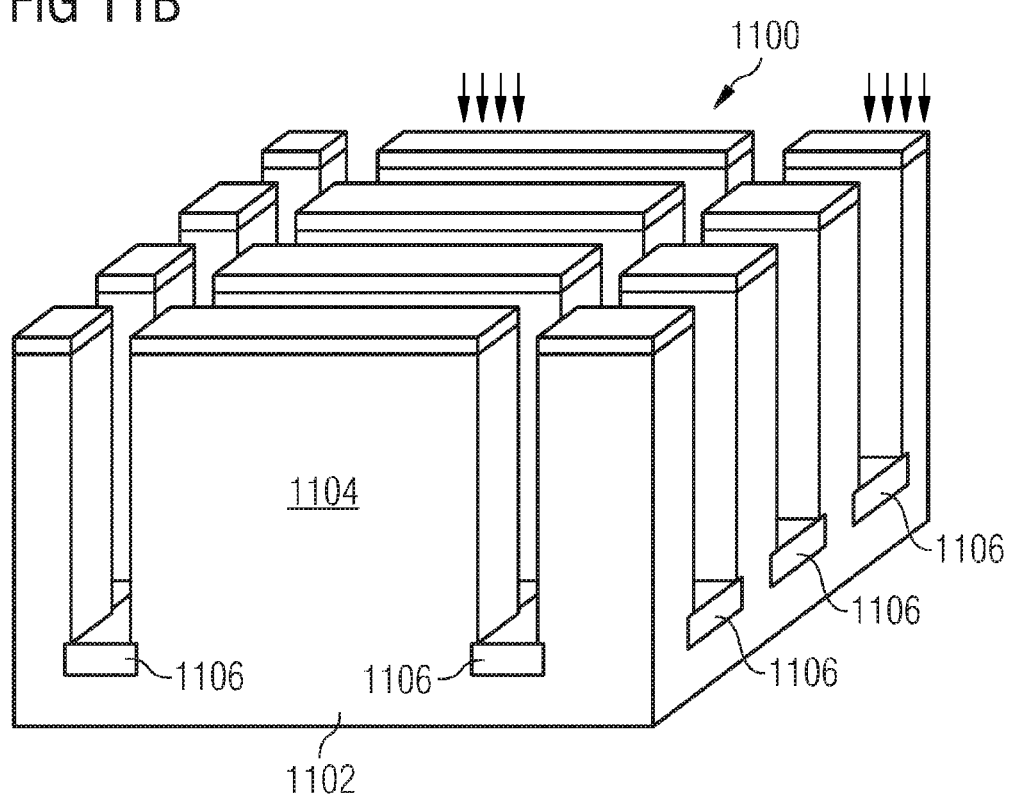

Next, as shown in FIG. 11B, a channel stop implantation process is used to form a channel stop layer 1106. The channel stop implantation process may employ conventional implantation techniques, using conventional dopants, such as boron for the formation of a p-type channel stop layer, or phosphorus, arsenic and/or antimony for an n-type channel stop layer. Of course, the channel stop layer 1106 may be formed by other techniques, which may use other dopant materials.

Figure 11C:
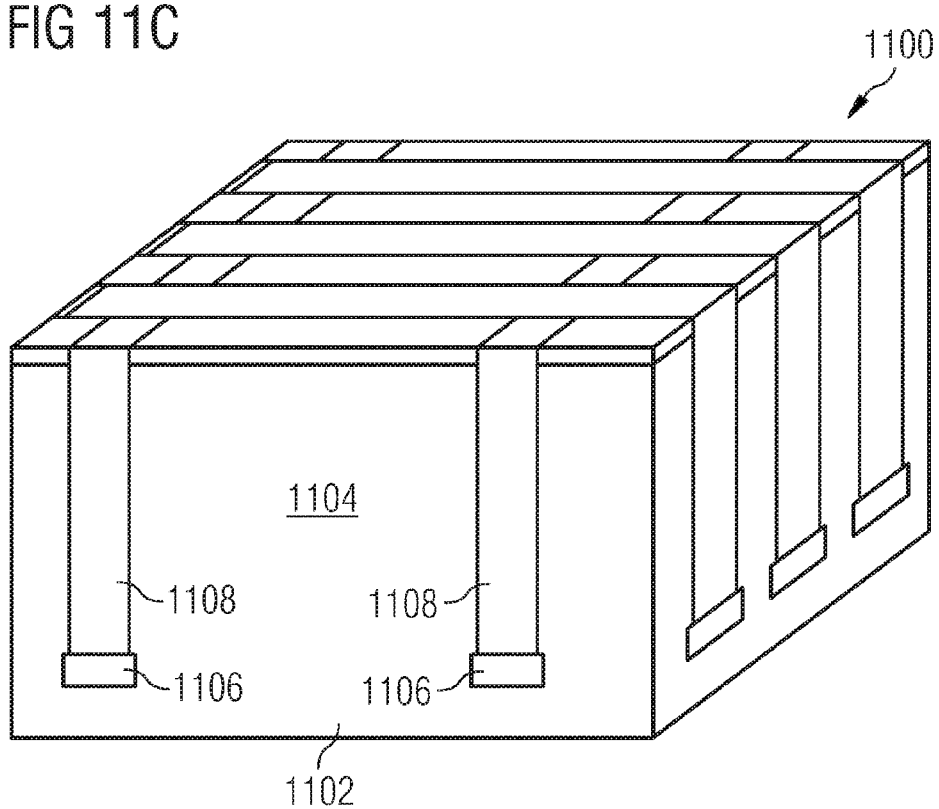

FIG. 11C shows the results of the next step, in which the trenches between the elongated structures 1104 are filled with an oxide material 1108 to form isolation structures separating the elongated structures 1104. The oxide material 1108 may be applied using conventional deposition techniques. The oxide material 1108 may then be planarized, using, for example, chemical-mechanical planarization (CMP) techniques.

Figure 11D:
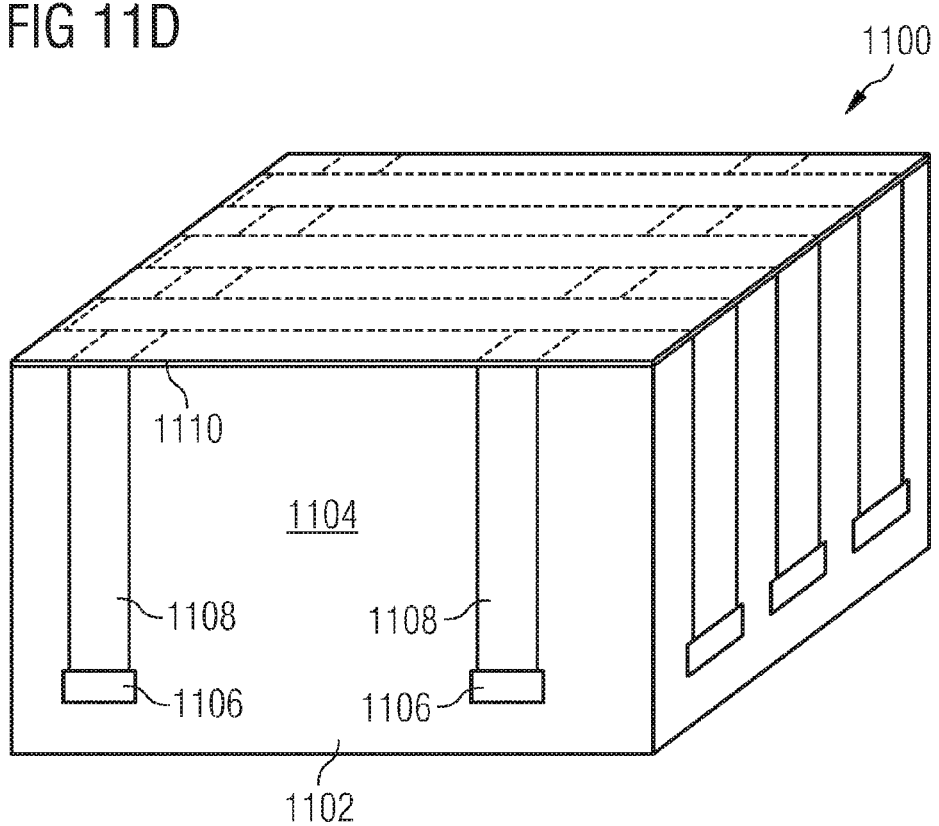
Figure 11E:
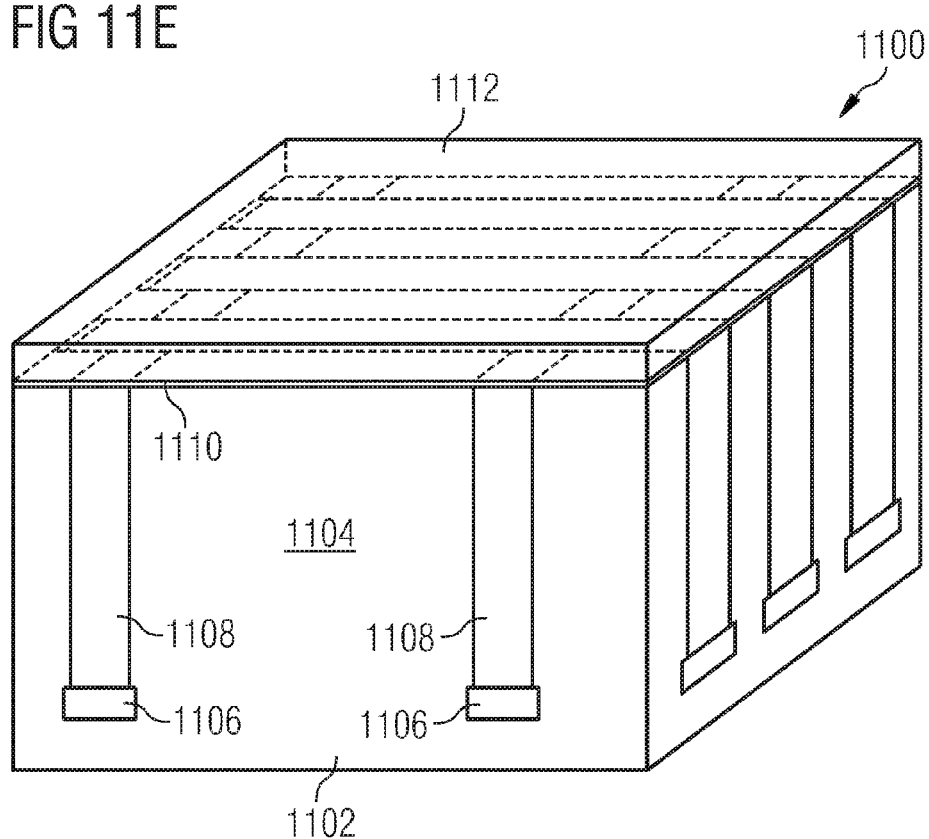

Next, as shown in FIG. 11D, a top pad oxide layer 1110 is formed. The top pad oxide layer 1110 may be formed using a conventional oxide growth technique. A nitride layer 1112 may then be deposited, as shown in FIG. 11E.

Figure 11F:
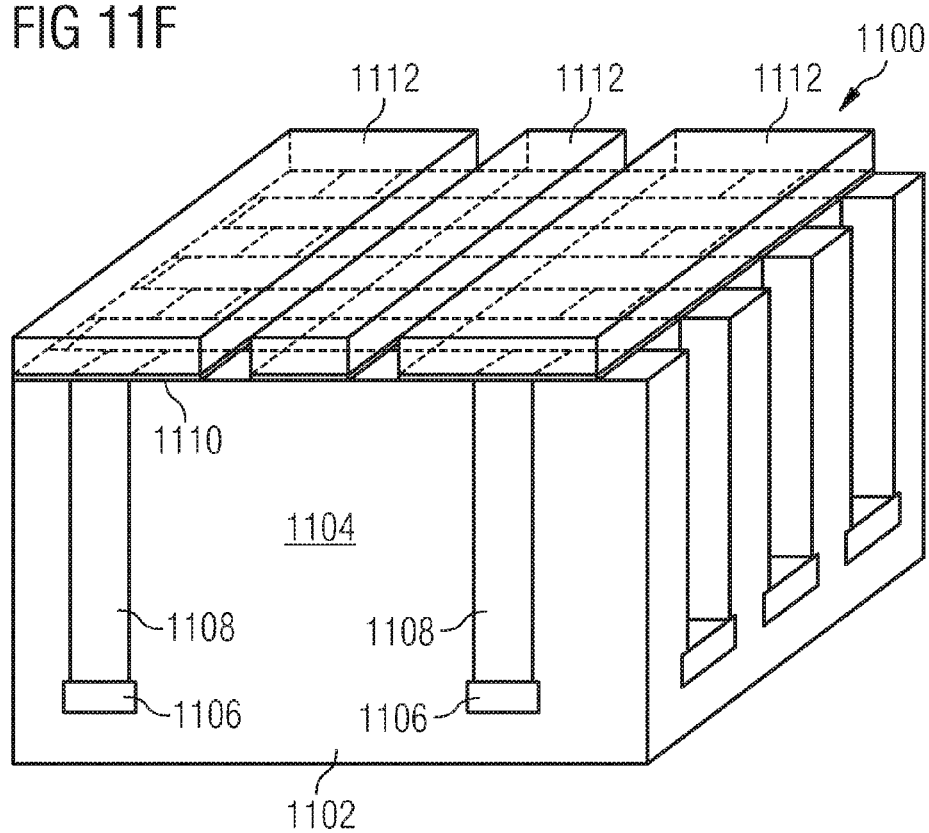

FIG. 11F shows the results of the next step, in which the nitride layer 1112 is etched according to a gate pattern, to expose portions of the device 1100 in which a gate will be formed. This patterning and etching may be performed, for example, using conventional lithography and etching techniques.

Figure 11G:
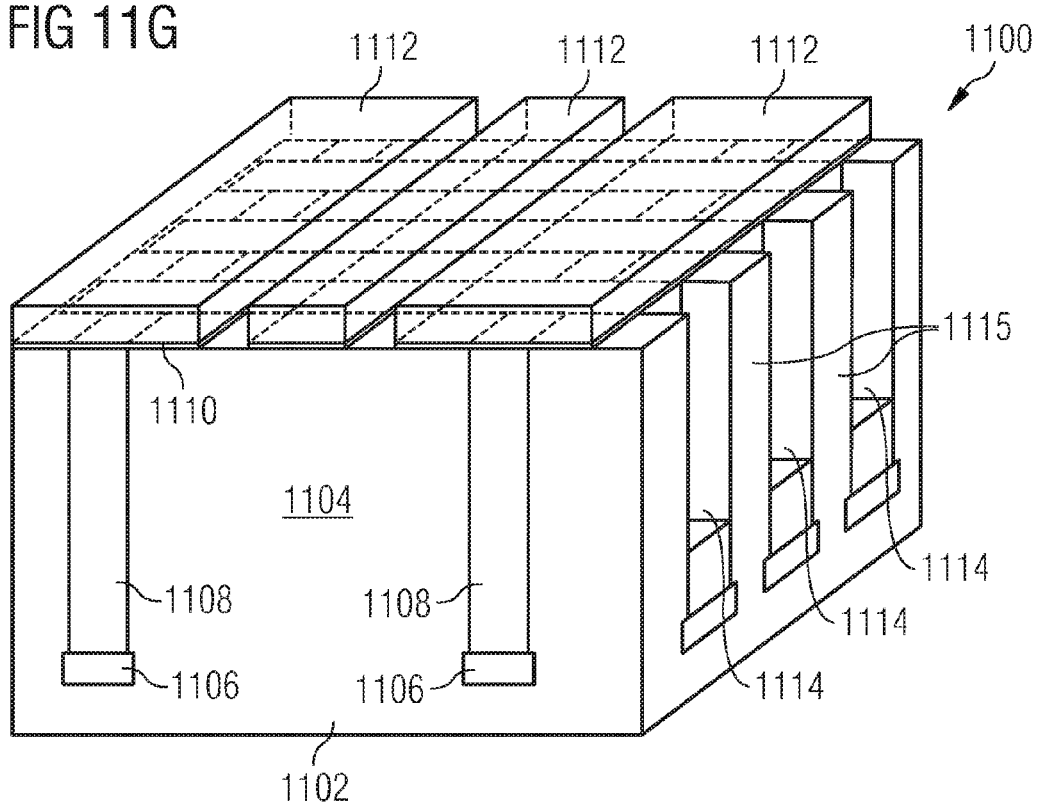

In FIG. 11G, the oxide has been etched from the gate pattern areas where the nitride was removed in the previous step. This results in the formation of trenches 1114, adjacent to fin structures 1115 formed from portions of the elongated structures 1104. The fin structures 1115 will form the channel portions of the transistors. As can be seen, some of the oxide material 1108 remains in the trenches 1114.

After the trenches 1114 have been etched, channel doping/counterdoping can be carried out, in which the exposed channel areas (i.e., the fin structures 1115). Conventional doping techniques, such as ion implantation, using convention dopants, such as boron for p-type conductivity, or phosphorus, arsenic, and/or antimony for n-type conductivity, may be used, though use of other known or later discovered doping techniques and/or dopant materials also is possible.

Figure 11H:
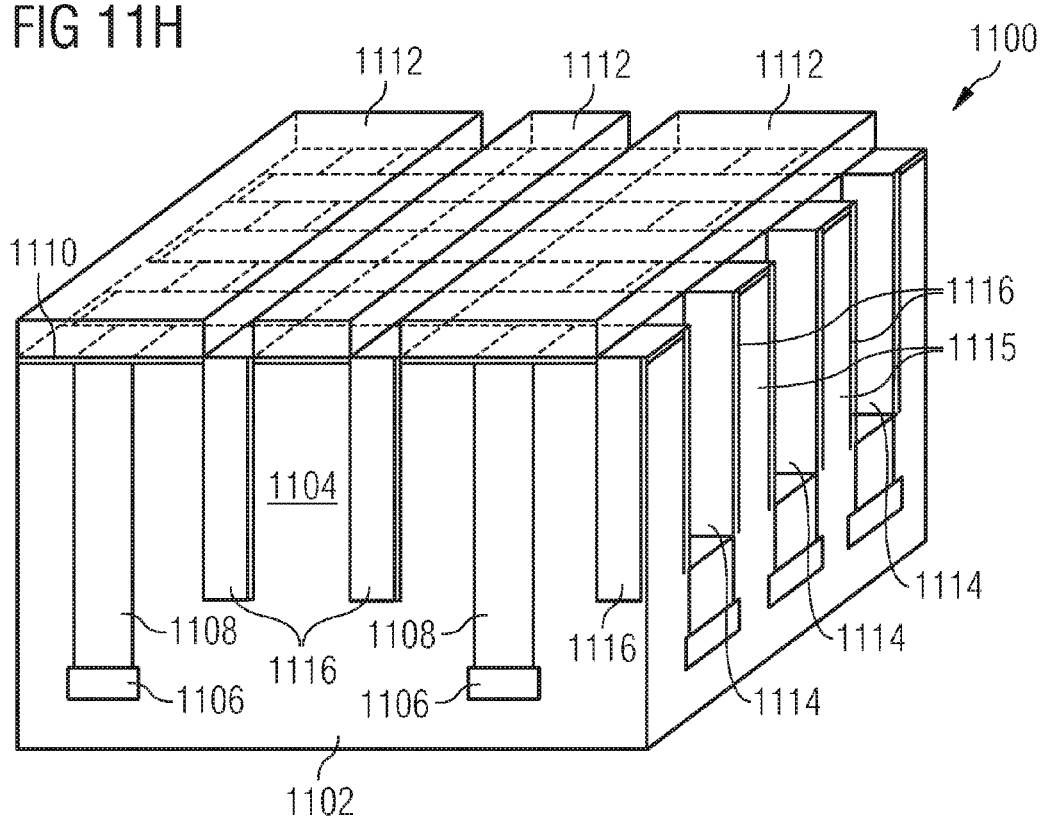

FIG. 11H shows the results of the next step, in which gate oxides 1116 have been formed around the fin structures 1104 in the areas of the gate patterns. The gate oxides 1116 may be formed by conventional oxidation techniques.

Figure 11I:
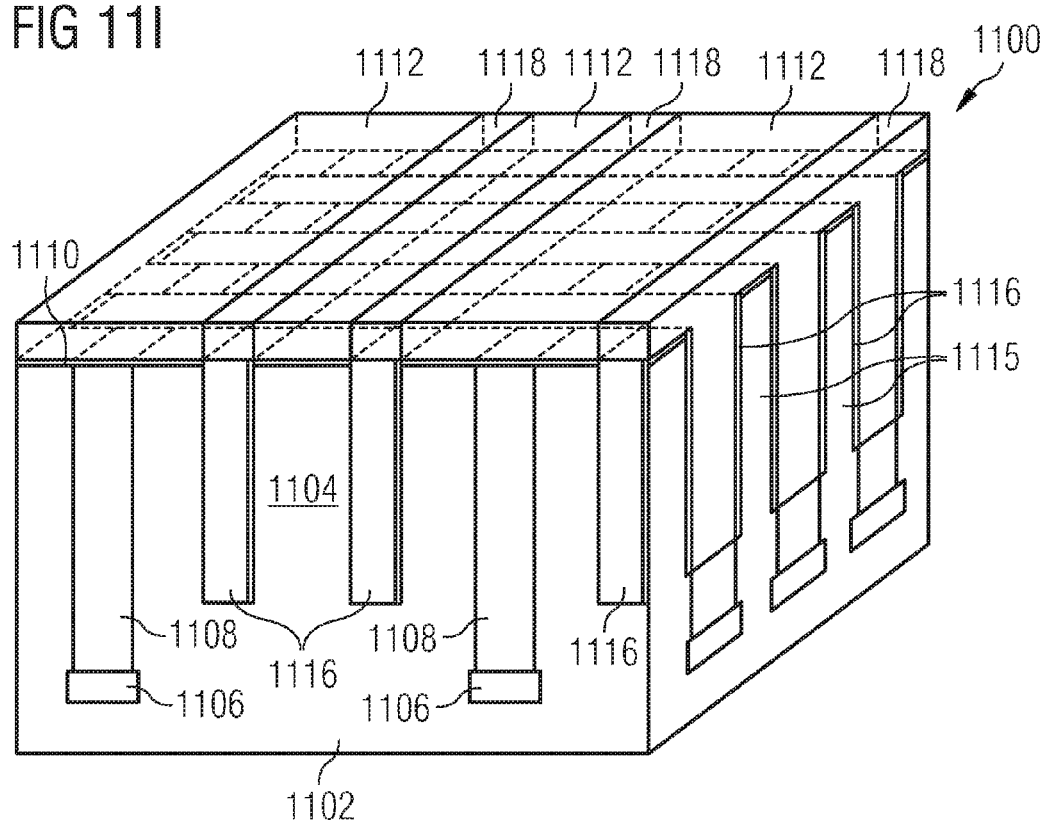

Next, as shown in FIG. 11I, the areas of the gate patterns are filled with a conductive gate material, such as doped polysilicon. Filling these areas forms gate structures 1118 that surround the fin structures 1115 and gate oxides 1116, to complete formation of the gates for the FinFETs. Conventional deposition techniques may be used to deposit the gate material. Following deposition of the material, CMP techniques may be used to planarize the gate structures 1118. As discussed above, the gate structures 1118 also serve as word lines for selecting particular memory cells for reading or writing.

Figure 11J:
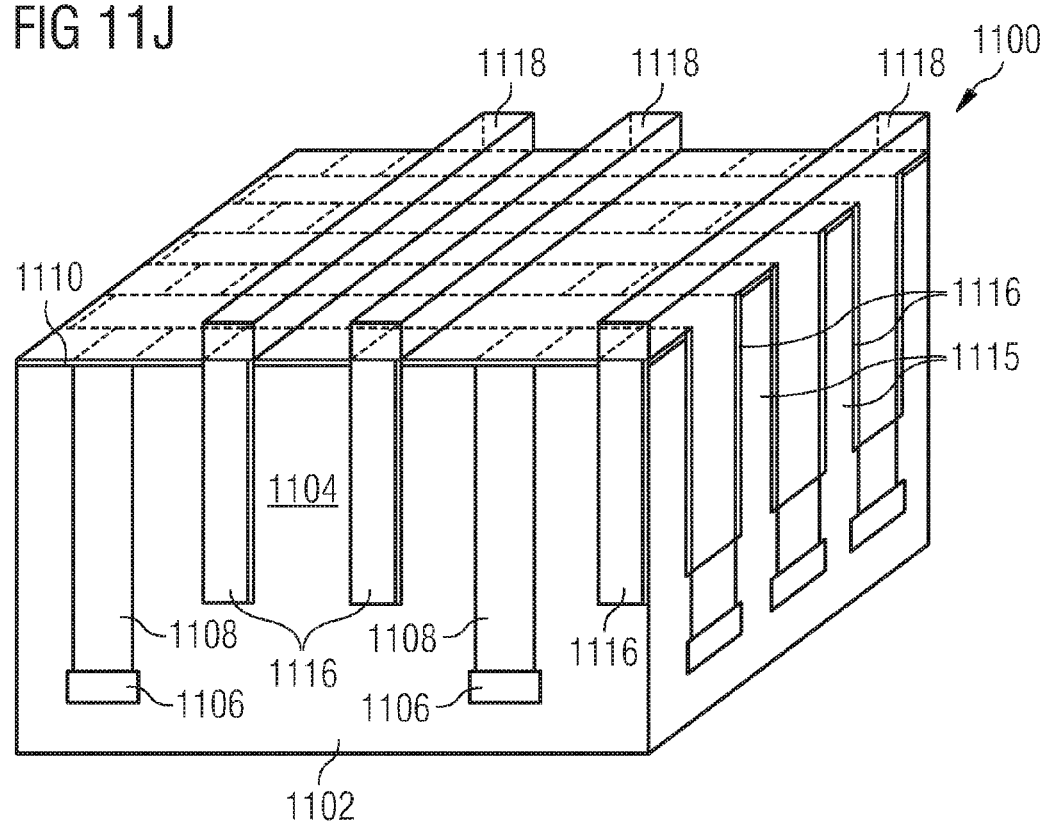

FIG. 11J shows the results of the next step, in which the nitride layer 1112 has been removed. This may be accomplished, for example, using conventional etching techniques.

Figure 11K:
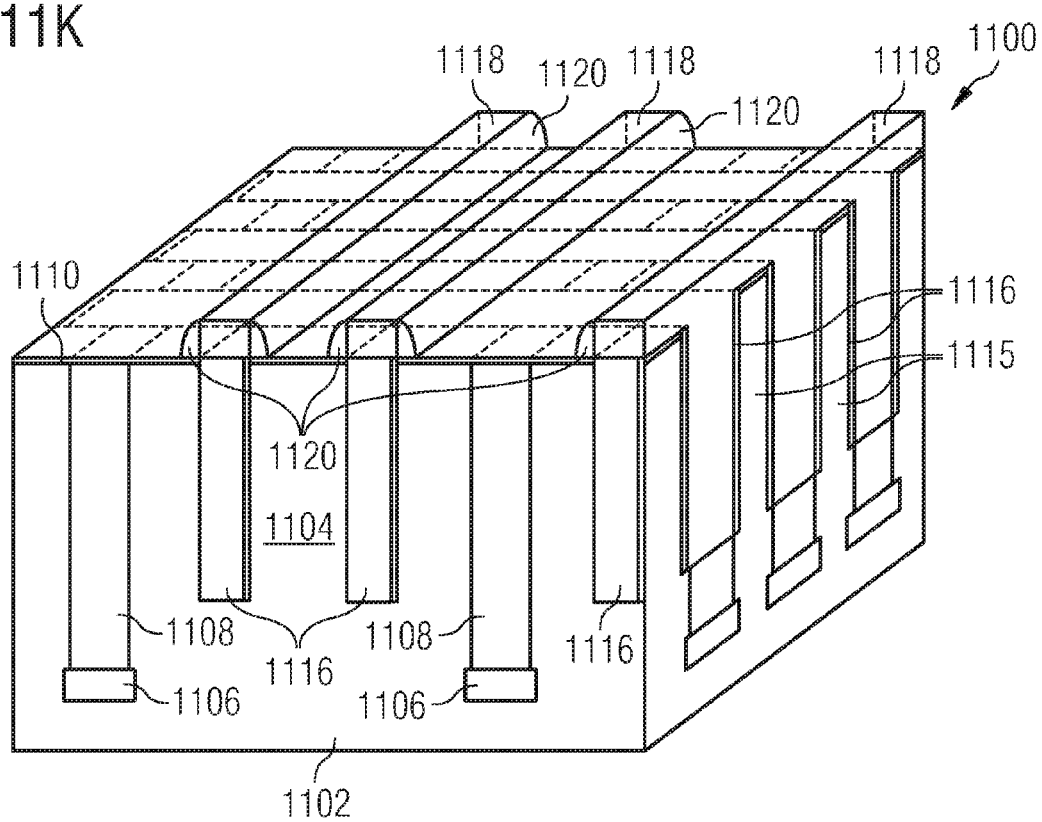

As shown in FIG. 11K, sidewall spacers 1120 are formed around a portion of the gate structures 1118. The sidewall spacers 1120 are formed using conventional semiconductor processing techniques. For example, in some embodiments, the sidewall spacers 1120 may be formed by depositing an insulating material such as an oxide, nitride or oxynitride of silicon, and then using etching to form the sidewall spacers 1120 from the deposited material. The sidewall spacers 1120 may be used in some embodiments for aligning contacts (not shown) and vias (not shown).

Figure 11L:
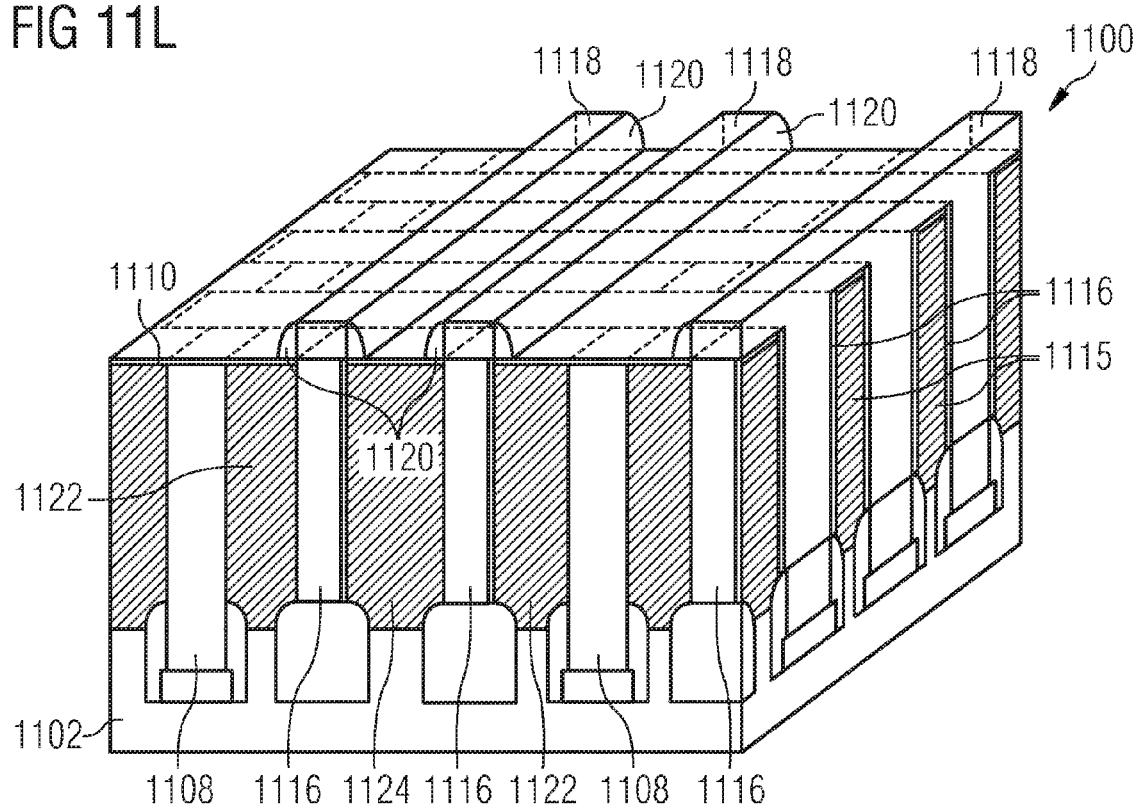

Next, as shown in FIG. 11L, the source regions 1122 and drain regions 1124 are doped for either n-type or p-type conductivity. If the portions of the fin structures 1115 that are surrounded by the gate oxides 1116 and gate structures 1118 are doped for n-type conductivity, then the source regions 1122 and drain regions 1124 may be doped for p-type conductivity. If the portions of the fin structures 1115 that are surrounded by the gate oxides 1116 and gate structures 1118 are doped for p-type conductivity, then the source regions 1122 and drain regions 1124 may be doped for n-type conductivity. The doping of the source regions 1122 and drain regions 1124 may be carried out using conventional doping techniques, such as ion implantation, using convention dopants, such as boron for p-type conductivity, or phosphorus, arsenic, and/or antimony for n-type conductivity, though other appropriate dopant materials may be used.

Figure 11M:
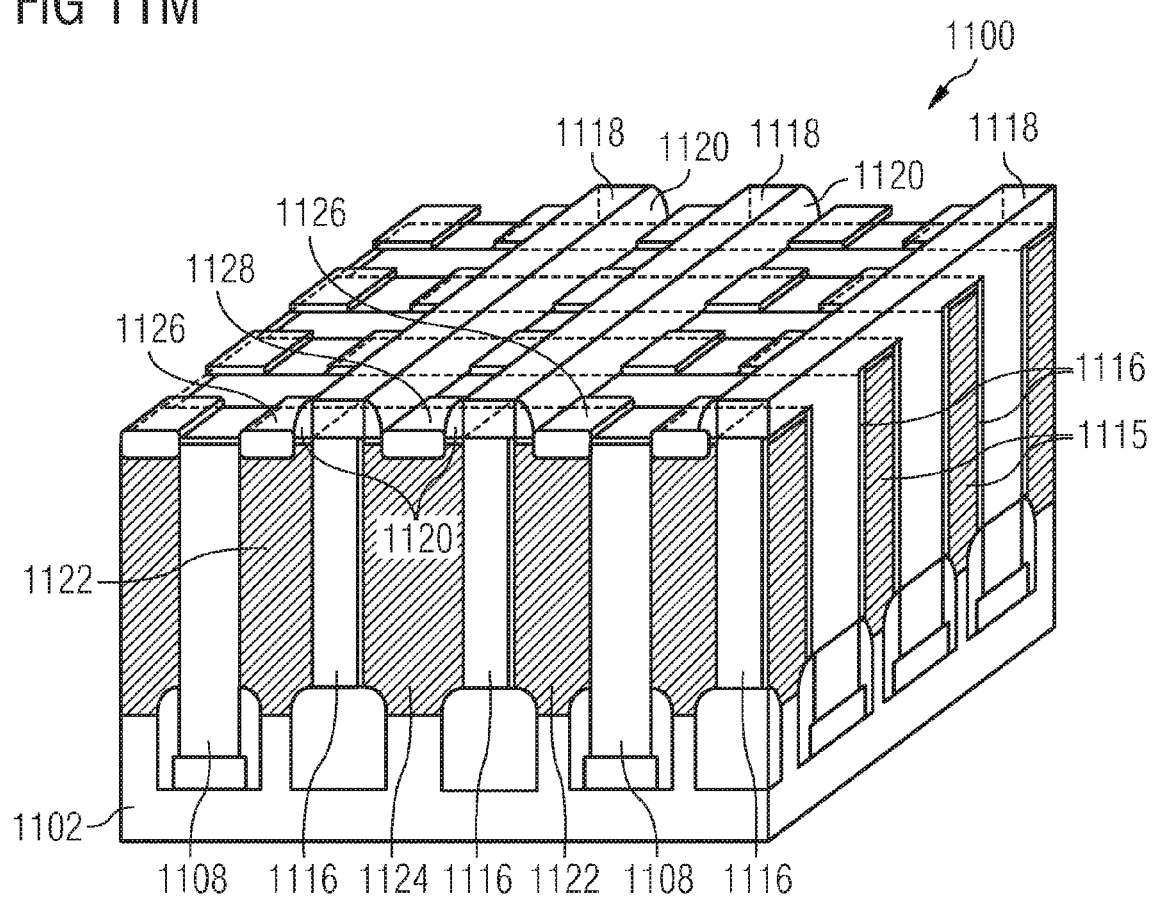

Next, in the step shown in FIG. 11M, a salicidation process is used to form source contacts 1126 and drain contacts 1128.

This generally involves depositing a metal over the areas of silicon where the contacts are to be formed, and then reacting the metal with the silicon to form a silicide at a high temperature, during an anneal or sinter process. Of course, other salicidation methods or methods of forming contacts for the FinFETs also may be used.

Once the contacts have been formed, the FEOL process is complete, and the FinFETs on bulk silicon for use with a resistivity changing memory device have been formed. A BEOL process, similar to that illustrated below, in which vias, metal bit lines and common lines, and the magnetoresistive memory elements are fabricated may be used to complete the memory device.

In some embodiments, the amount of current that can be driven by a single FinFET may not be sufficient for switching some types of high-current memory technologies, such as some types of resistivity changing memories. For example, some types of MRAM, PCRAM, and carbon memory devices may require high switching currents that may be difficult to drive with a single FinFET. In accordance with an embodiment of the invention, in such cases, two or more FinFETs may be used to drive the needed switching current. As will be seen below, some such embodiments may have a cell size below 10 $F^2$, permitting memory devices to be constructed that have densities similar to those that may be achieved using low switching current technologies, such as DRAM.

Figure 12A:
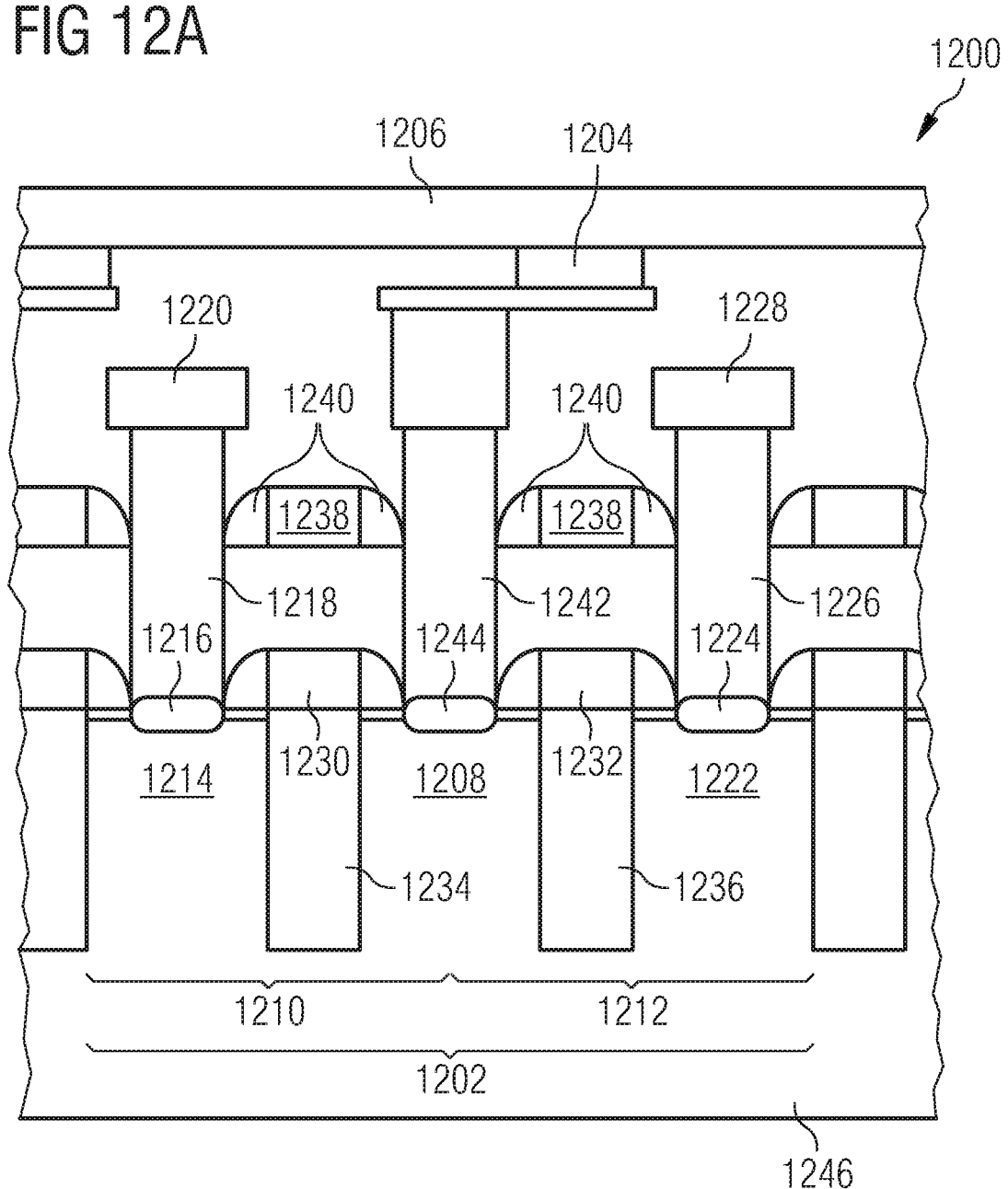
Figure 12C:
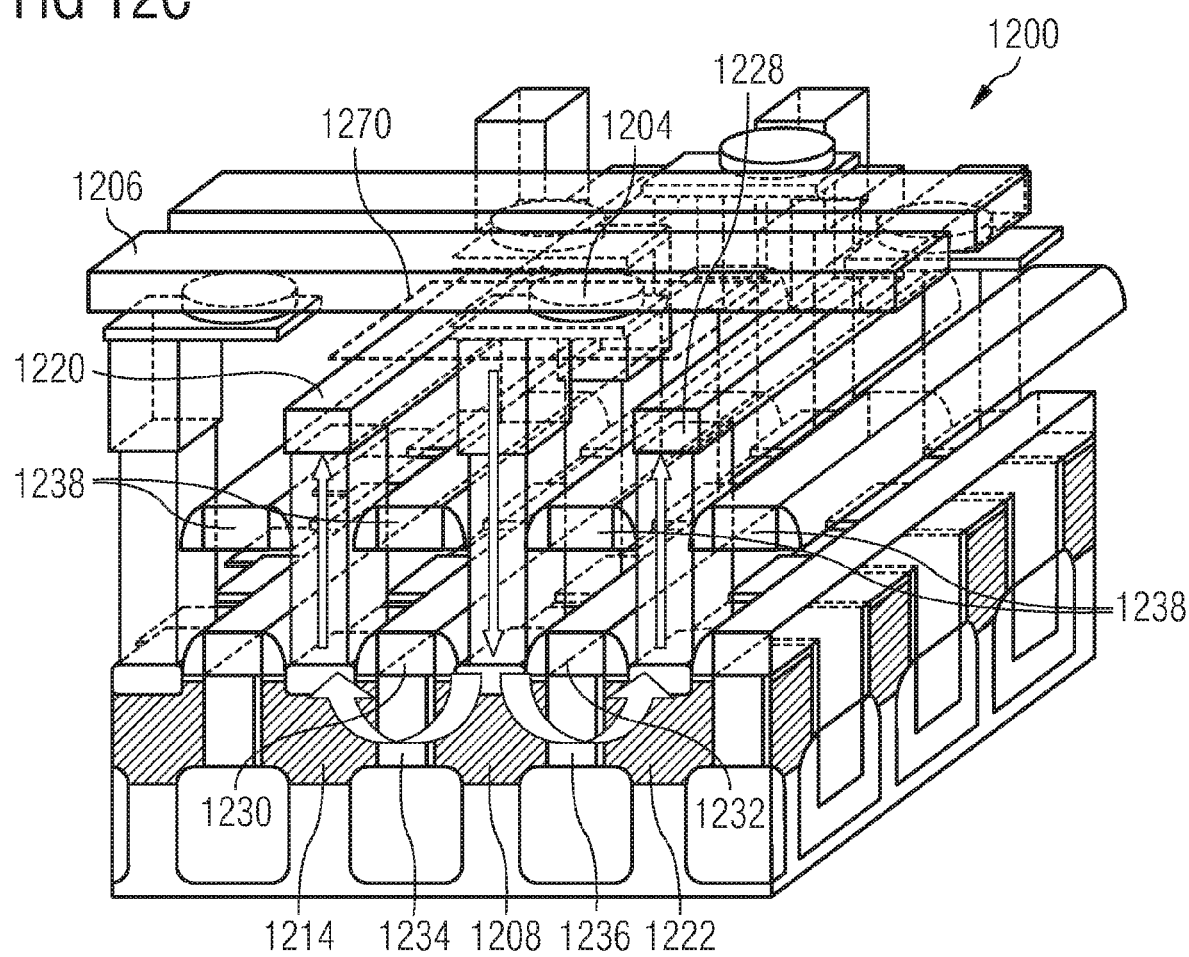

FIGS. 12A-C show an embodiment of an integrated circuit MRAM device in which two FinFETs are used to drive the switching current. As seen in FIG. 12A, a cell 1202 of the integrated circuit memory device 1200 includes a magnetoresistive memory elements 1204, connected through a source via 1242 and a source contact 1244 between a bit line 1206 and a source region 1208 of a first FinFET 1210 and a second FinFET 1212. A first drain region 1214 is shared by an adjacent FinFET, and is electrically connected through a first drain contact 1216 a first drain via 1218 to a first common line 1220, which may be connected to ground. Similarly, a second drain region 1222 (which is also shared by an adjacent FinFET) is electrically connected through a second drain contact 1224 and a second drain via 1226 to a second common line 1228, which may be connected to ground. A first gate 1230 and a second gate 1232 also serve as word lines, and surround a first gate oxide layer 1234 and a second gate oxide layer 1236 of the first FinFET 1210 and the second FinFET 1212, respectively. In some embodiments, additional lines 1238, including spacers 1240 are used for aligning the source via 1242 and the first and second drain vias 1218 and 1226. The first FinFET 1210 and second FinFET 1212 are formed in a substrate 1246.

To select a cell in the memory device 1200 for a high current switching operation, both the first gate 1230 and the second gate 1232 are activated (using the word lines associated with the gates), permitting current to be driven through both the first FinFET 1210 and the second FinFET 1212. It is noted that the drain regions 1214 and 1222 are shared with other neighboring FinFETs that belong to other adjacent memory cells. This concept will be used throughout below without further indication.

FIG. 12B shows a layout of memory cells in the integrated circuit memory device 1200, in accordance with an embodiment of the invention. As can be seen, the length of the cell 1202 includes half of the length of the shared first and second drain regions 1214 and 1222, the length of the source region 1208, and the width of the first and second gates 1230 and 1232. The width of the cell 1202 includes the width of the active areas of the cell 1202, as well as the width (half on either side of the cell 1202) of an isolation region 1252.

Due to use of FinFETs, in accordance with an embodiment of the invention, the width of the transistor is no longer limiting on the current that the transistor can drive, so the width of the cell may depend on other factors, such as the contact width and minimum feature size. Accordingly, the width of the cell shown in FIG. 8B, $W_{cell}$, may be approximately 130 nm, while the length of the cell, $L_{cell}$, may be approximately 320 nm. With a node size of 65 nm, this means that the cell has a width of approximately 2 F, and a length of approximately 4.92 F, giving an area of approximately 9.84 $F^2$, which is below the 10 $F^2$ area that is needed to provide a density that is competitive with many other memory technologies, such as DRAM.

In FIG. 12C, a three-dimensional view of the integrated circuit memory device 1200 is shown, including both FEOL and BEOL structures. In this view, the area of a single cell 1270 is outlined. Arrows in the image show the flow of current through the two FinFETs of the cell 1270.

FIGS. 13A-13I, a BEOL process for manufacturing a memory device using two FinFETs, in accordance with an embodiment of the invention. In this example embodiment, the resistivity changing memory device is an MRAM device. It will, however, be understood that a similar process could be used for the manufacture of other memory devices, including resistivity changing memory devices, that may use a relatively high switching current.

Figure 13A:
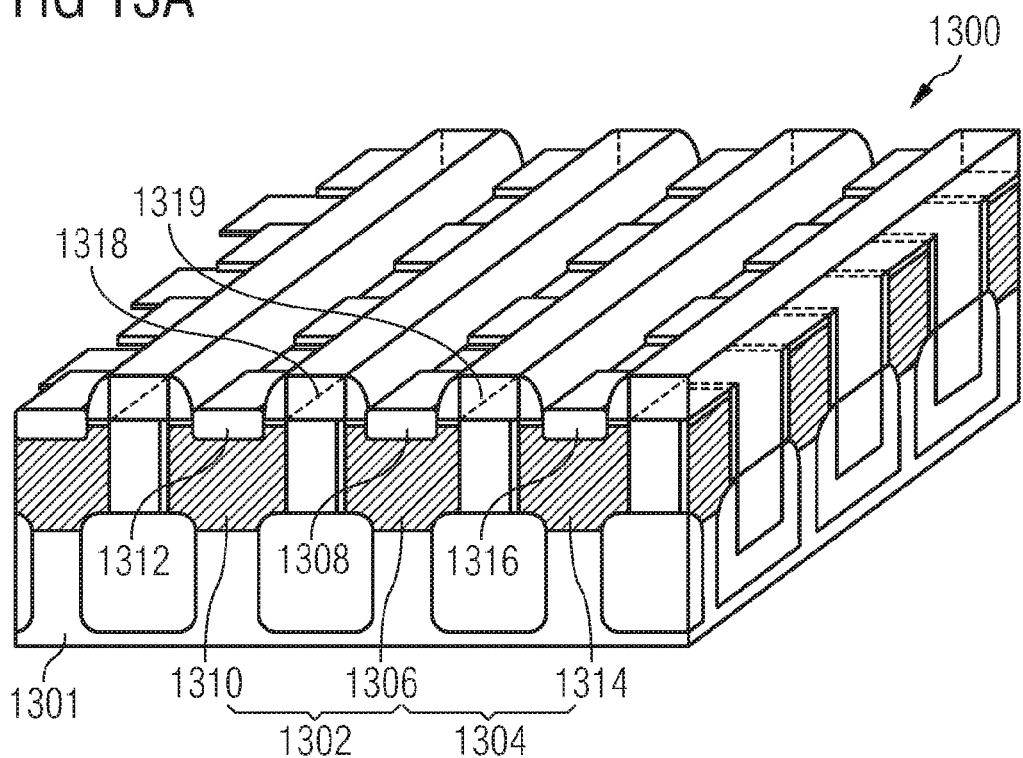
FIGS. 13A-13I show steps in a back-end-of-line (BEOL) process for manufacturing an integrated circuit memory device in accordance with an embodiment of the invention.

FIG. 13A shows a partially manufactured memory device 1300 at the start of the BEOL process. The memory device 1300 already includes FinFETs 1302 and 1304, including a source region 1306, a source contact 1308, a first drain region 1310, a first drain contact 1312, a second drain region 1314, a second drain contact 1316, a first gate 1318, and a second gate 1319, all formed on a substrate 1301 (bulk silicon in this embodiment, though SOI or other types of substrate are also possible). The first gate 1318 and second gate 1319 also serve as word lines. These structures were formed during a FEOL process similar to those described above with reference to FIGS. 10A-10L or FIGS. 11A-11M, with slight modifications to provide for two FinFETs per cell. As described above, a salicidation process has been used to form the source contact 1308, the first drain contact 1312, and the second drain contact 1316. It should be noted that while all of the FEOL structures are present in FIGS. 13B-13I, to keep the figures from being too cluttered, they will not be labeled in later figures unless they are being discussed. For similar reasons, parts labeled in some of the drawings may not be labeled in others, where they are not discussed in the accompanying text.

Figure 13B:
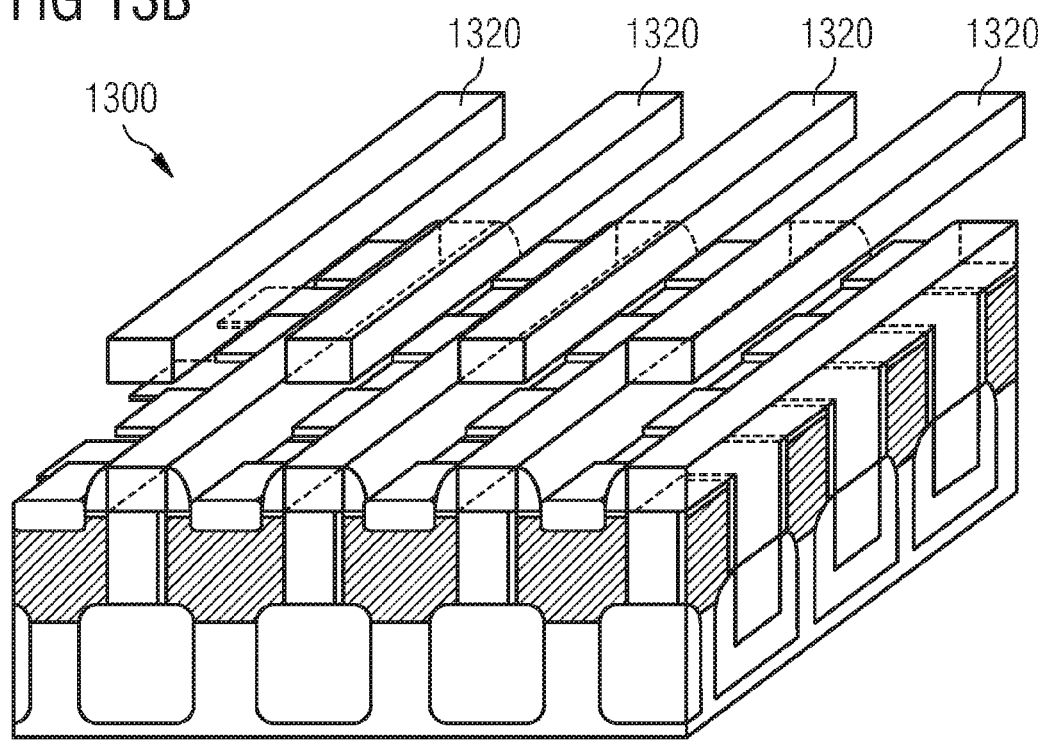

FIG. 13B shows the next step in the process of manufacturing the memory device 1300. After depositing a dielectric material (not shown for sake of clarity), in an M0 metallization step, extra lines 1320 are formed. In some embodiments, the extra lines 1320 may be used only for the purpose of forming self-aligned vias in a subsequent step, while in other embodiments, the extra lines 1320 may be used for carrying electrical signals.

Figure 13C:
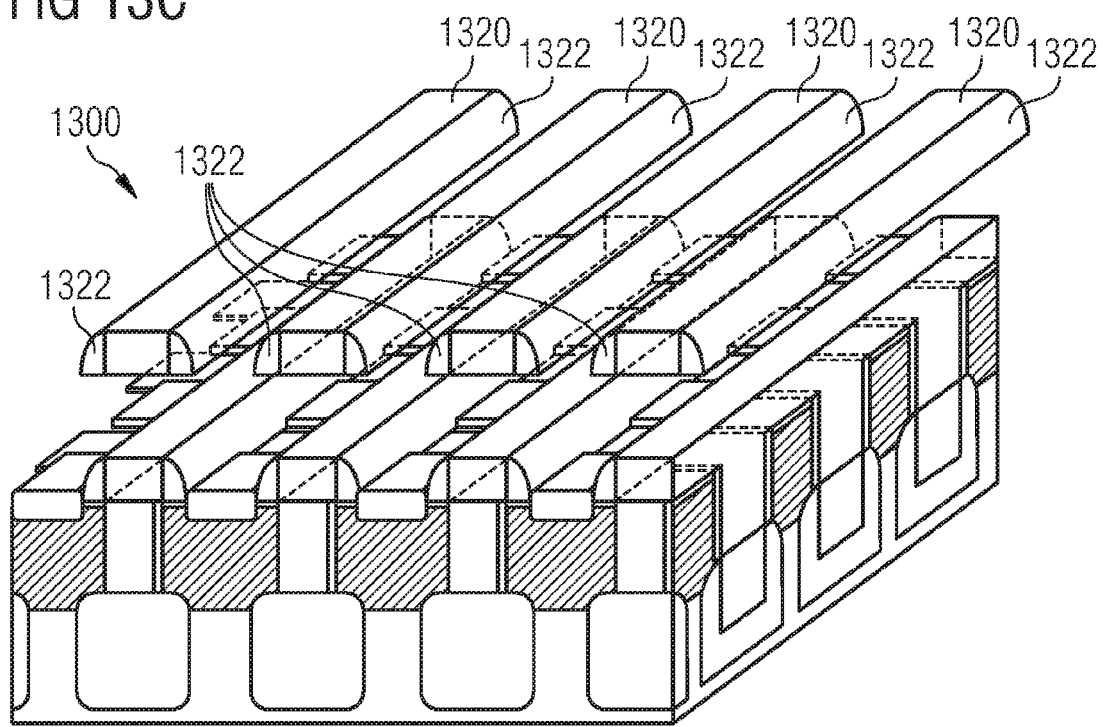

Next, as shown in FIG. 13C, sidewall spacers 1322 are formed around the extra lines 1320. In some embodiments, these sidewall spacers 1322 will be used for forming self-aligned vias in a subsequent step. In some embodiments, the sidewall spacers 1322 may be formed by depositing an insulating material such as an oxide, nitride or oxynitride of silicon, and then using etching to form the sidewall spacers 1322 from the deposited material. In some embodiments, the sidewall spacers may be formed from an insulating material different than the dielectric material deposited in the previous step, so that the sidewall spacers may be etched without having a substantial effect on the underlying dielectric material.

Figure 13D:
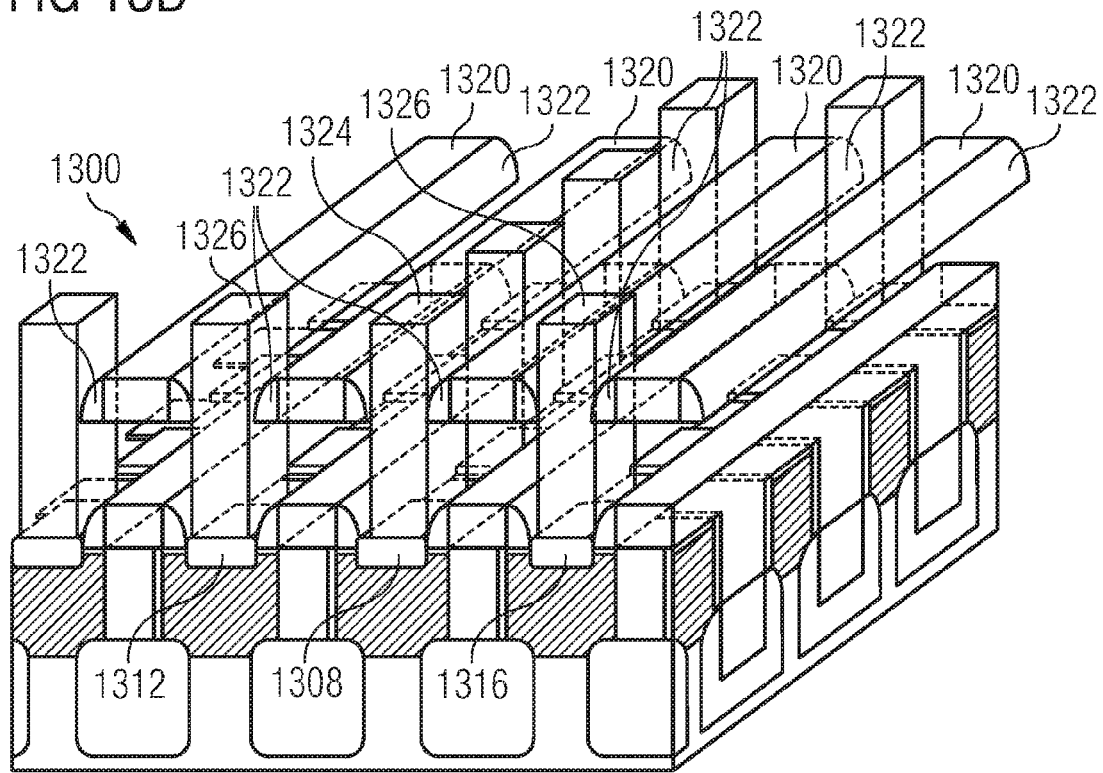

FIG. 13D shows a next step, in which an inter-layer dielectric (ILD) material (not shown) is deposited and, in some embodiments, planarized. Conventional deposition techniques, such as chemical vapor deposition (CVD), and conventional planarization techniques, such as CMP may be used to deposit and planarize the ILD material, though other techniques may be used.

Deep vias, including a source via 1324 and drain vias 1326 are formed in alignment with the source contact 1308, and the first and second drain contacts 1312 and 1316. Holes for these vias may be formed by conventional lithographic and etching techniques. In some embodiments, the extra lines 1320 and spacers 1322 are used to align the vias. The vias are then filled with a conductive material, such as a metal material, and planarized. This may be accomplished using conventional deposition and planarization techniques. In some embodiments, filling the vias is done as part of the metallization step described below with reference to FIG. 13E.

Figure 13E:
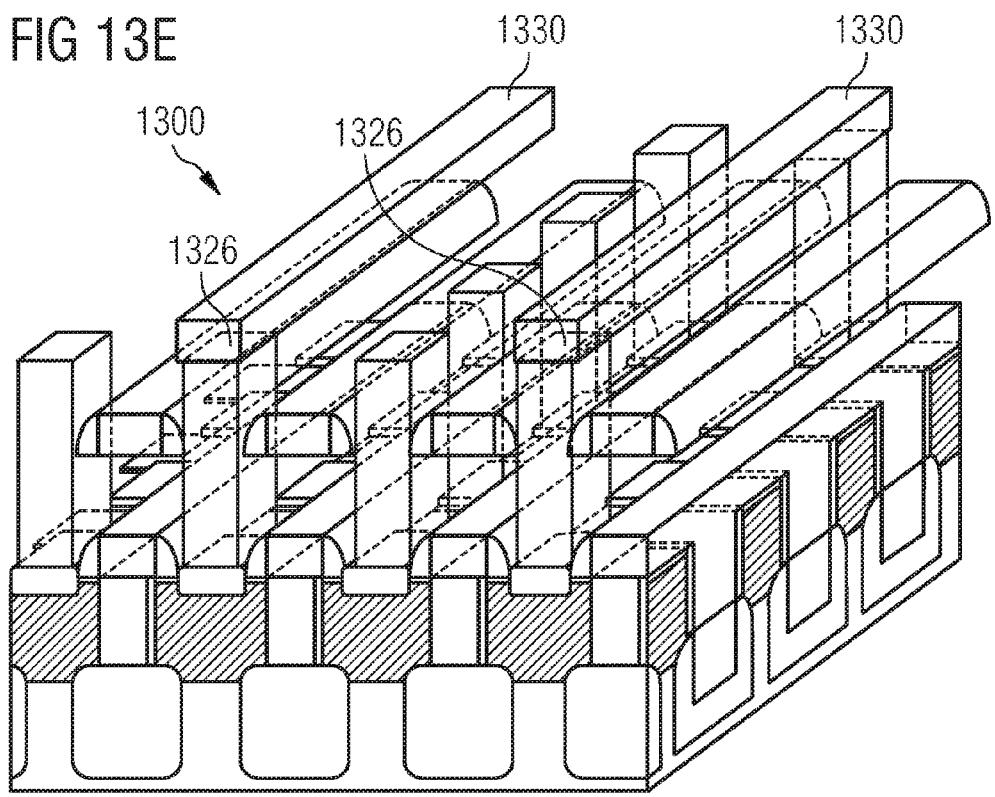

Next, as shown in FIG. 13E, an M1 metallization layer is formed, including common lines 1330. The common lines 1330 may be formed of a conductive material, such as a metal material, and are electrically connected to the drain vias 1326. In some embodiments, the common lines 1330 may be electrically connected to ground. The conductive material may be deposited using conventional deposition techniques, and patterned using, for example, conventional lithographic and etching techniques.

Figure 13F:
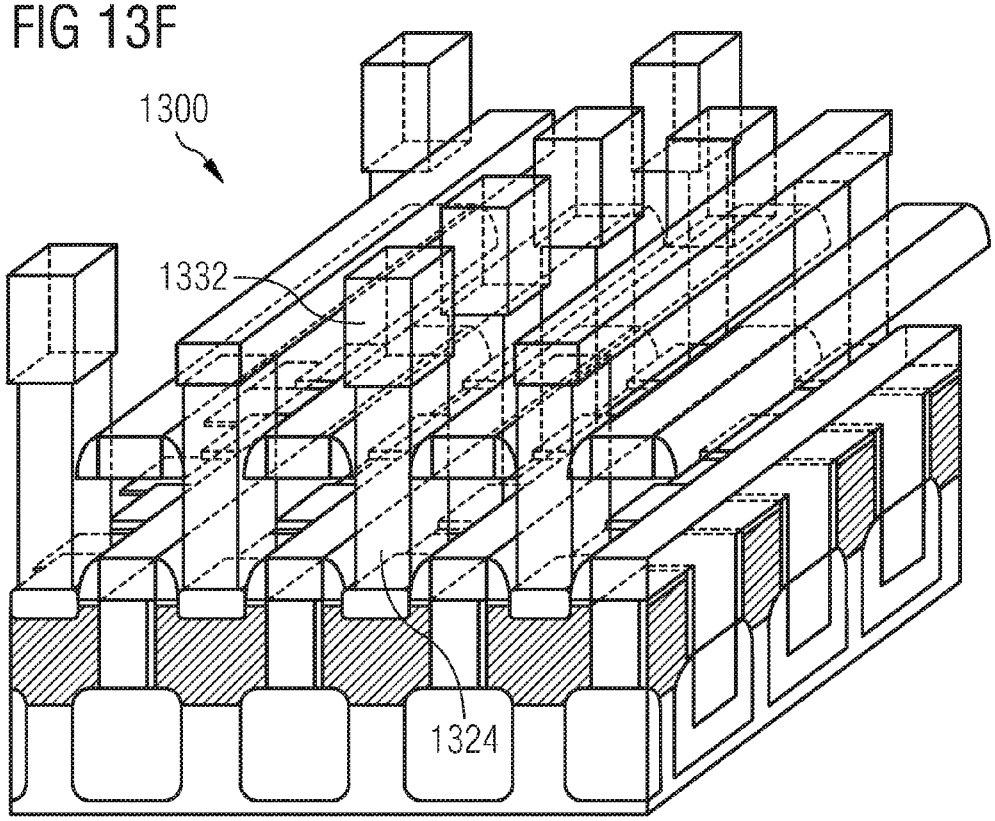

In FIG. 13F, a next step is shown, in which a further layer of an ILD material (not shown) is deposited and, in some embodiments, planarized. Conventional deposition techniques, such as CVD, and conventional planarization techniques, such as CMP may be used to deposit and planarize the ILD material, though other techniques may be used.

A second via 1332 is formed in the layer of ILD material, aligned with and electrically connected to the source via 1324. A hole for the second via 1332 may be formed by conventional lithographic and etching techniques. The second via 1332 may be filled with a conductive material, such as a metal material, and planarized. This may be accomplished using conventional deposition and planarization techniques. In some embodiments, filling the second via 1332 may be part of the step of forming the memory element connector, as described below with reference to FIG. 13G.

Figure 13G:
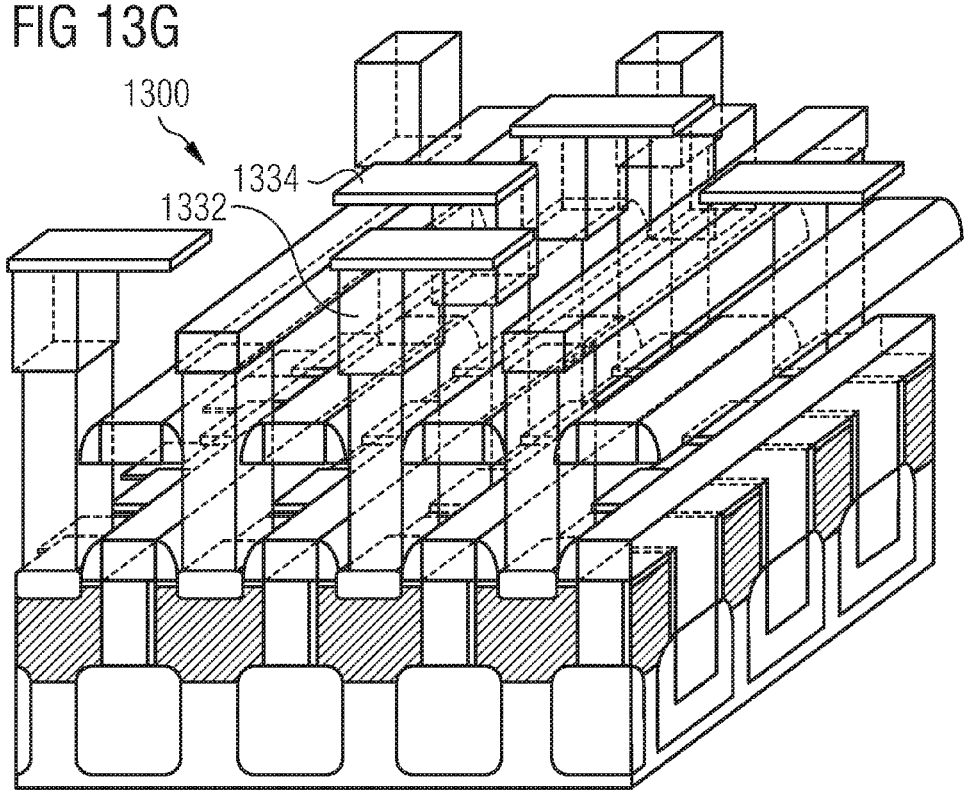

Next, as shown in FIG. 13G, a memory element connector 1334 is formed. The memory element bottom connector 1334 is formed of a conductive material, such as a metal, and is electrically connected to the second via 1332. In some embodiments, the memory element connector 1334 may be formed by depositing and patterning the conductive material using conventional techniques.

Figure 13H:
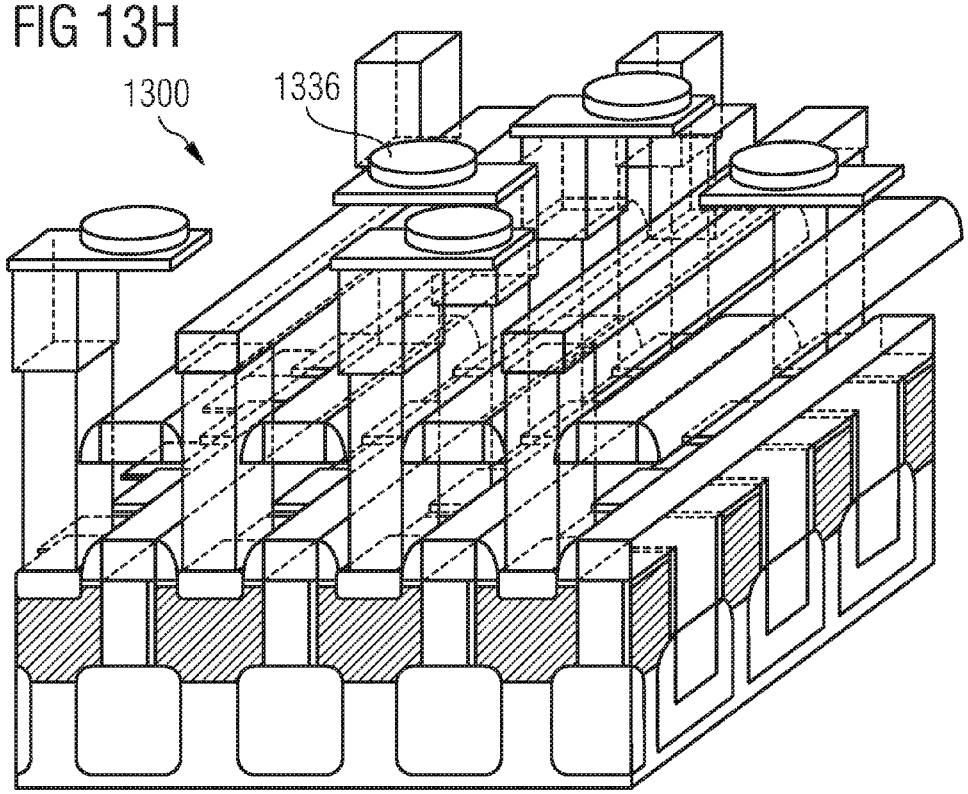

FIG. 13H shows a next step, in which a memory element 1336, such as a resistivity changing memory element is formed. In the example embodiment depicted in FIG. 13H, the memory element 1336 includes a magnetoresistive memory element, though other types of memory elements may be used. To form a magnetoresistive memory element, numerous magnetic metal layers of materials such as PtMn, CoFe, Ru, and NiFe may be deposited to form a free layer (not shown) and a fixed layer (not shown). A tunnel layer (not shown), including a dielectric material such as MgO or $Al_2O_3$ may be formed between the free layer and the fixed layer. Additionally, materials for ohmic heating may be deposited for use in a thermal select magnetoresistive memory element. It will be understood that other methods of forming a magnetoresistive memory element, a resistivity changing memory element, or other high switching current memory element may be used in accordance with various embodiments of the invention.

Figure 13I:
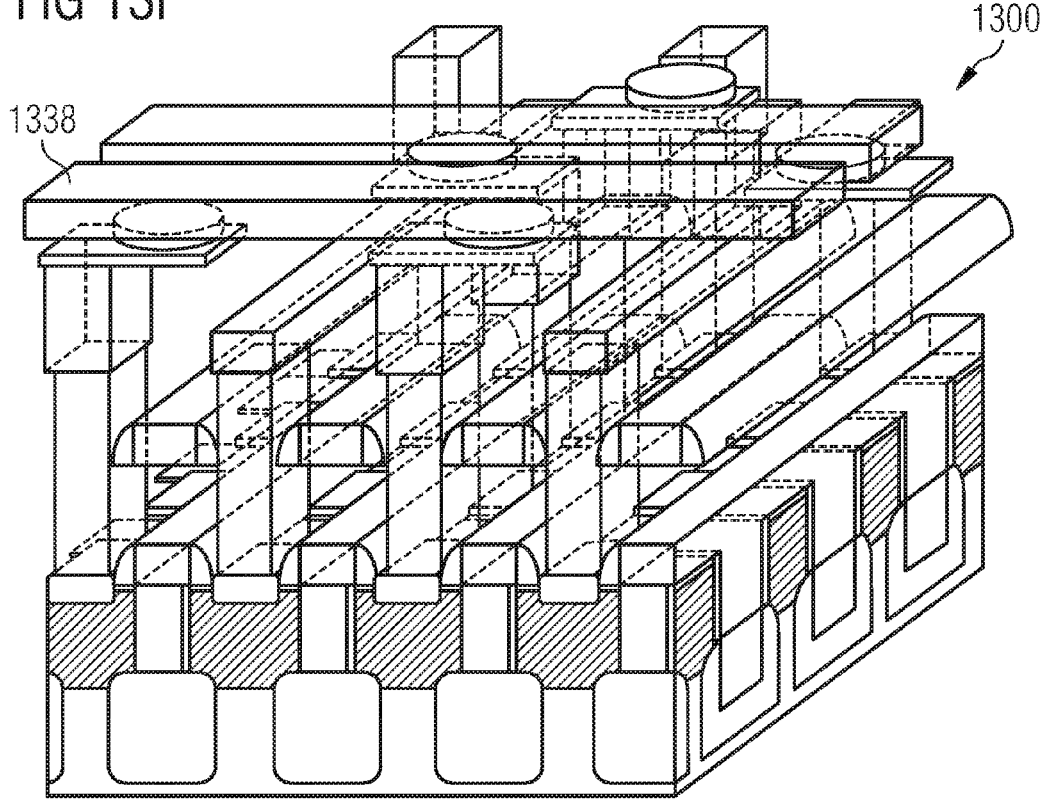

Finally, as shown in FIG. 13I, a bit line 1338 is formed in an M2 metallization layer. The bit line 1338 is formed of a conductive material, such as a metal material. The conductive material may be deposited using conventional deposition techniques, and patterned using, for example, conventional lithographic and etching techniques. Optionally, an additional top contact electrode (not shown) is used to provide an electrical contact between the bit line 1338 and memory element 1336.

Formation of the bit line 1338 completes the formation of the memory device 1300, though in some embodiments, additional layers and devices may be formed on an integrated circuit above the memory device 1300. It will be understood that the BEOL process described with reference to FIGS. 13A-13I could be used, with slight modifications, with the single FinFET embodiments shown above in FIGS. 10A-10L and FIGS. 11A-11M, or with other single or multi FinFET embodiments of the invention.

Figure 14A:
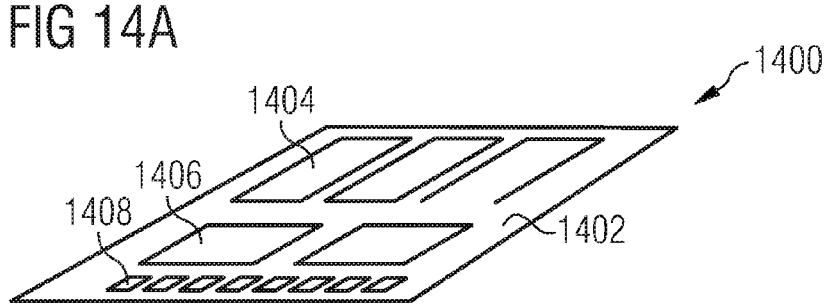
FIGS. 14A and 14B show a memory module that may include an integrated circuit memory device according to an embodiment of the invention.
Figure 14B:
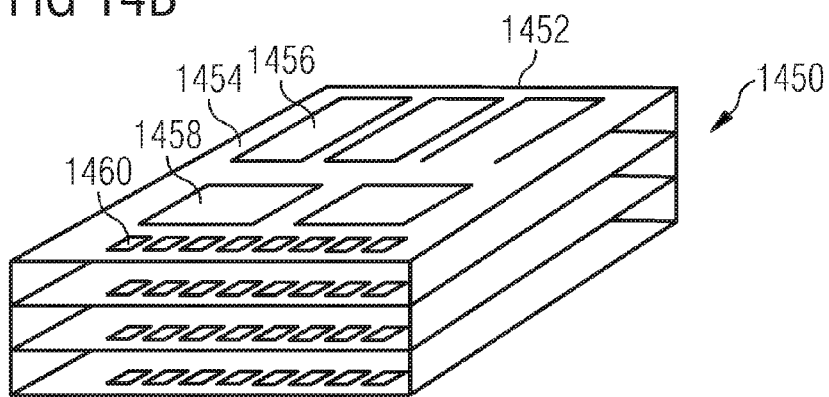

Memory cells formed using a FinFET in accordance with an embodiment of the invention may be used in memory devices that contain large numbers of such cells. These cells may, for example, be organized into an array of memory cells having numerous rows and columns of cells, each of which stores more than one bit of information. Memory devices of this sort may be used in a variety of applications or systems. As shown in FIGS. 14A and 14B, in some embodiments, memory devices such as those described herein may be used in modules. In FIG. 14A, a memory module 1400 is shown, on which one or more memory devices 1404 are arranged on a substrate 1402. Each memory device 1404 may include numerous memory cells in accordance with an embodiment of the invention. The memory module 1400 may also include one or more electronic devices 1406, which may include memory, processing circuitry, control circuitry, addressing circuitry, bus interconnection circuitry, or other circuitry or electronic devices that may be combined on a module with a memory device 1404. Additionally, the memory module 1400 includes multiple electrical connections 1408, which may be used to connect the memory module 1400 to other electronic components, including other modules. For example, the memory module 1400 may be plugged into a larger circuit board, including PC main boards, video adapters, cell phone circuit boards or portable video or audio players, among others.

As shown in FIG. 14B, in some embodiments, these modules may be stackable, to form a stack 1450. For example, a stackable memory module 1452 may include one or more memory devices 1456, arranged on a stackable substrate 1454. Each of the memory devices 1456 includes memory cells that employ memory elements in accordance with an embodiment of the invention. The stackable memory module 1452 also may include one or more electronic devices 1458, which may include memory, processing circuitry, control circuitry, addressing circuitry, bus interconnection circuitry, or other circuitry or electronic devices that may be combined on a module with a memory device 1456. Electrical connections 1460 are used to connect the stackable memory module 1452 with other modules in the stack 1450, or with other electronic devices. Other modules in the stack 1450 may include additional stackable memory modules, similar to the stackable memory module 1452 described above, or other types of stackable modules, such as stackable processing modules, control modules, communication modules, or other modules containing electronic components.

Thus, one embodiment provides an integrated circuit including a memory cell including a resistivity changing memory element and a first select transistor electrically coupled to the resistivity changing memory element, wherein the first select transistor includes a FinFET including a source, a drain, and a fin structure formed above a surface of a substrate between the source and the drain. The fin structure includes a channel area extending in a direction substantially parallel to the surface of the substrate, wherein a dielectric layer is formed around at least a portion of the channel area such that an effective channel width of the first select transistor depends at least in part on a height of the fin structure.

In some embodiments, a maximum switching current of the resistivity changing memory element depends at least in part on the height of the fin structure. In some embodiments, the substrate includes a silicon-on-insulator substrate. In other embodiments, the substrate includes a bulk silicon substrate.

In some embodiments, the resistivity changing memory element includes a magnetoresistive memory element. In some such embodiments, the magnetoresistive memory element is positioned to decrease magnetic interaction with magnetoresistive memory elements of adjacent memory cells.

In some embodiments, the resistivity changing memory element includes a phase changing memory element. In some embodiments, the resistivity changing memory element includes a carbon memory element. In some embodiments, the resistivity changing memory element includes a conductive bridging memory element.

In some embodiments, the memory cell has an area less than 10 $F^2$, where F is the minimum feature size on the integrated circuit.

In some embodiments, the memory cell further includes a second select transistor electrically coupled to the resistivity changing memory element, the second select transistor including a FinFET. In some of these embodiments, the first select transistor and the second select transistor share one of the source and the drain. In some such embodiments, a maximum switching current for the resistivity changing memory element depends on a maximum current driven by the first select transistor and a maximum current driven by the second select transistor.

In one embodiment, a method of manufacturing an integrated circuit is provided, the method including providing a substrate; forming a first FinFET above a surface of the substrate, the first FinFET including a source, a drain, and a fin structure disposed between the source and the drain, the fin structure including a channel area extending in a direction substantially parallel to the surface of the substrate, wherein a dielectric layer is formed around at least a portion of the channel area such that an effective channel width of the first FinFET depends at least in part on a height of the fin structure; and forming a resistivity changing memory element electrically coupled to the first FinFET. In some embodiments, the method further includes depositing a first dielectric material above the substrate; forming first and second lines above the dielectric material; forming sidewall spacers adjacent to the first and second lines; and using the sidewall spacers to align a via with at least one of the source region and the drain region. In some of these embodiments, forming sidewall spacers includes depositing a second dielectric material, different from the first dielectric material, and etching the second dielectric material to form the sidewall spacers.

In some embodiments, forming the first FinFET includes etching a trench to define an elongated structure; doping a first portion of the elongated structure to form the source; doping a second portion of the elongated structure to form the drain, such that the remaining portion of the elongated structure forms the fin structure extending between the source and the drain to form the channel area; forming the dielectric layer around at least a portion of the channel area; and depositing a conductive material in at least a portion of the trench surrounding the dielectric layer to form a gate.

In some embodiments, providing a substrate includes providing a silicon on insulator substrate. In other embodiments, providing a substrate includes providing a bulk silicon substrate.

In some embodiments, the method further includes forming a second FinFET above the surface of the substrate, the second FinFET electrically coupled to the resistivity changing memory element. In some such embodiments, forming the second FinFET includes forming the second FinFET such that the Second FinFET shares one of the source and the drain with the first FinFET.

In some embodiments, forming a resistivity changing memory element includes forming a magnetoresistive memory element. In some of these embodiments, forming a magnetoresistive memory element includes positioning the magnetoresistive memory element in an asymmetric pattern with respect to adjacent magnetoresistive memory elements to decrease magnetic interaction with said adjacent magnetoresistive memory elements.

In some embodiments, forming a resistivity changing memory element includes forming a phase changing memory element. In some embodiments, forming a resistivity changing memory element includes forming a carbon memory element. In some embodiments, forming a resistivity changing memory element includes forming a conductive bridging memory element. In some embodiments, forming a resistivity changing memory element includes forming a transition metal oxide memory element.

Another embodiment provides an integrated circuit including a substrate, a resistivity changing memory element, and a first select transistor electrically coupled to the resistivity changing memory element. The first select transistor includes a FinFET including a first source/drain area, a second source/drain area, and a fin structure formed above a surface of the substrate between the first source/drain area and the second source/drain area. The fin structure includes a channel area extending in a direction substantially parallel to the surface of the substrate, wherein a dielectric layer is formed around at least a portion of the channel area such that an effective channel width of the first select transistor depends at least in part on a height of the fin structure, and a gate formed surrounding the dielectric layer, the gate controlling a flow of current through the channel area. The integrated circuit further includes a bit line electrically coupled to the first source/drain area of the first select transistor, a word line electrically coupled to the gate of the first select transistor, and a common line electrically coupled to the second source/drain area of the first select transistor.

In some embodiments, the bit line is electrically coupled to the first source/drain area of the first select transistor through a self-aligned via. In some embodiments, the common line is electrically coupled to the second source/drain area of the first select transistor through a self-aligned via. In some embodiments, the integrated circuit further includes an extra line surrounded by sidewall spacers, the extra line and sidewall spacers used for alignment of a self-aligned via.

In some embodiments, a maximum switching current of the resistivity changing memory element depends at least in part on the height of the fin structure.

In some embodiments, the substrate includes a silicon-on-insulator substrate. In other embodiments, the substrate includes a bulk silicon substrate.

In some embodiments, the resistivity changing memory element includes one of a magnetoresistive memory element, a phase changing memory element, a carbon memory element, and a conductive bridging memory element.

In some embodiments, the integrated circuit further includes a second select transistor electrically coupled to the resistivity changing memory element, the second select transistor including a FinFET. In some such embodiments, a maximum switching current for the resistivity changing memory element depends on a maximum current driven by the first select transistor and a maximum current driven by the second select transistor.

Another embodiment of the invention provides a method of manufacturing an integrated circuit, including providing a substrate, and performing a front-end-of-line (FEOL) process in which a first FinFET is formed above a surface of the substrate. The first FinFET includes a source, a drain, and a fin structure disposed between the source and the drain, the fin structure including a channel area extending in a direction substantially parallel to the surface of the substrate. A dielectric layer is formed around at least a portion of the channel area such that an effective channel width of the first FinFET depends at least in part on a height of the fin structure. The method further includes performing a back-end-of-line (BEOL) process in which a resistivity changing memory element is formed, the resistivity changing memory element electrically coupled to the first FinFET.

In some embodiments, performing a FEOL process further includes forming a second FinFET above the surface of the substrate. In some of these embodiments, forming the second FinFET includes forming the second FinFET such that the Second FinFET shares one of the source and the drain with the first FinFET.

In some embodiments, performing a BEOL process further includes forming a via that electrically connects the second FinFET to the resistivity changing memory device.

In some embodiments, performing a FEOL process includes etching a trench to define an elongated structure; doping a first portion of the elongated structure to form the source; doping a second portion of the elongated structure to form the drain, such that the remaining portion of the elongated structure forms the fin structure extending between the source and the drain to form the channel area; forming the dielectric layer around at least a portion of the channel area; and depositing a conductive material in at least a portion of the trench surrounding the dielectric layer to form a gate.

In some embodiments, performing a BEOL process includes depositing a first dielectric material above the substrate; forming first and second lines above the dielectric material; forming sidewall spacers adjacent to the first and second lines; and using the sidewall spacers to align a via with at least one of the source region and the drain region.

In some embodiments, performing a back-end-of-line (BEOL) process in which a resistivity changing memory element is formed includes forming one of a magnetoresistive memory element, a phase changing memory element, a carbon memory element, a conductive bridging memory element, and a transition metal oxide memory element.

In still another embodiment, an integrated circuit is provided, including resistivity changing memory means for storing information using a change in resistivity of the resistivity changing memory means; and a first select transistor electrically coupled to the resistivity changing memory means, wherein the first select transistor includes a FinFET including a source, a drain, and a fin structure formed above a surface of a substrate between the source and the drain, the fin structure including a channel area extending in a direction substantially parallel to the surface of the substrate, wherein a dielectric layer is formed around at least a portion of the channel area such that an effective channel width of the first select transistor depends at least in part on a height of the fin structure.

In some embodiments, the integrated circuit further includes a second select transistor electrically coupled to the resistivity changing memory means, the second select transistor including a FinFET.

In another embodiment, a memory module is provided, including a plurality of integrated circuits, wherein the integrated circuits include a memory cell including a resistivity changing memory element and a first select transistor electrically coupled to the resistivity changing memory element. The first select transistor includes a FinFET including a source, a drain, and a fin structure formed above a surface of a substrate between the source and the drain, the fin structure including a channel area extending in a direction substantially parallel to the surface of the substrate. A dielectric layer is formed around at least a portion of the channel area such that an effective channel width of the first select transistor depends at least in part on a height of the fin structure.

In some embodiments, a maximum switching current of the resistivity changing memory element depends at least in part on the height of the fin structure.

In some embodiments, the memory cell has an area less than 10 $F^2$, where F is the minimum feature size on the integrated circuit.

In some embodiments, the memory cell further includes a second select transistor electrically coupled to the resistivity changing memory element, the second select transistor including a FinFET.

In some embodiments, the resistivity changing memory element includes one of a magnetoresistive memory element, a phase changing memory element, a carbon memory element, a conductive bridging memory element, and a transition metal oxide memory element.

In some embodiments, the memory module is stackable.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. An integrated circuit comprising:
   a memory cell comprising a resistivity changing memory element and a first select transistor electrically coupled to the resistivity changing memory element, wherein the first select transistor comprises a FinFET comprising a source, a drain, and a fin structure formed above a surface of a substrate between the source and the drain, the fin structure comprising a channel area extending in a direction substantially parallel to the surface of the substrate, wherein one of the source and drain is electrically coupled to the resistivity changing memory element, wherein a dielectric layer is formed around at least a portion of the channel area such that an effective channel width of the first select transistor depends at least in part on a height of the fin structure, wherein a maximum switching current of the resistivity changing memory element depends at least in part on the height of the fin structure, and wherein a single gate surrounds the dielectric layer, the single gate controlling a flow of current through the channel area.

2. The integrated circuit of claim 1, wherein at least one adjacent memory cell shares at least one of the source and the drain.

3. The integrated circuit of claim 1, wherein the resistivity changing memory element comprises one of a magnetoresistive memory element, a phase changing memory element, a carbon memory element, a transition metal oxide memory element, or a conductive bridging memory element.

4. The integrated circuit of claim 1, wherein the resistivity changing memory element comprises a magnetoresistive memory element positioned to decrease magnetic interaction with magnetoresistive memory elements of adjacent memory cells.

5. The integrated circuit of claim 1, wherein the memory cell has an area less than $10 F^2$, where F is a minimum feature size on the integrated circuit.

6. The integrated circuit of claim 1, wherein the memory cell further comprises a second select transistor electrically coupled to the resistivity changing memory element, the second select transistor comprising a FinFET.

7. The integrated circuit of claim 6, wherein the maximum switching current for the resistivity changing memory element depends on a maximum current driven by the first select transistor and a maximum current driven by the second select transistor.

8. An integrated circuit comprising:
a substrate;
a resistivity changing memory element having a first terminal and a second terminal;
a first select transistor electrically coupled to the first terminal of the resistivity changing memory element, the first select transistor comprising a FinFET comprising a first source/drain area, a second source/drain area, and a fin structure formed above a surface of the substrate between the first source/drain area and the second source/drain area, the fin structure comprising a channel area extending in a direction substantially parallel to the surface of the substrate, wherein one of the first source/drain area and the second source/drain area is electrically coupled to the resistivity changing memory element, wherein a dielectric layer is formed around at least a portion of the channel area such that an effective channel width of the first select transistor depends at least in part on a height of the fin structure, and wherein a single gate surrounds the dielectric layer, the gate controlling a flow of current through the channel area;
a bit line electrically coupled to the second terminal of the resistivity changing memory element;
a word line electrically coupled to the gate of the first select transistor; and
a common line electrically coupled to the second source/drain area of the first select transistor;
wherein a maximum switching current of the resistivity changing memory element depends at least in part on the height of the fin structure.

9. The integrated circuit of claim 8, further comprising a first via for electrically coupling one of first source/drain area and the second source/drain area to the resistivity changing memory element and a second via for electrically coupling an other of the first source/drain area and the second source/drain area to a common line; an extra line surrounded by sidewall spacers positioned between the first via and the second via, the extra line and sidewall spacers providing alignment for the first via and the second via.

10. The integrated circuit of claim 8, wherein a transistor of at least one adjacent memory cell shares at least one of the first source/drain area and the second source/drain area.

11. The integrated circuit of claim 8, wherein the resistivity changing memory element comprises one of a magnetoresistive memory element, a phase changing memory element, a carbon memory element, a transition metal oxide memory element, and a conductive bridging memory element.

12. The integrated circuit of claim 8, further comprising a second select transistor electrically coupled to the resistivity changing memory element, the second select transistor comprising a FinFET.

13. The integrated circuit of claim 12, wherein the maximum switching current for the resistivity changing memory element depends on a maximum current driven by the first select transistor and a maximum current driven by the second select transistor.

14. A memory module comprising:
a plurality of integrated circuits, wherein the integrated circuits comprise a memory cell comprising a resistivity changing memory element and a first select transistor electrically coupled to the resistivity changing memory element, wherein the first select transistor comprises a FinFET comprising a source, a drain, and a fin structure formed above a surface of a substrate between the source and the drain, the fin structure comprising a channel area extending in a direction substantially parallel to the surface of the substrate, wherein one of the source and drain is electrically coupled to the resistivity changing memory element, wherein a dielectric layer is formed around at least a portion of the channel area such that an effective channel width of the first select transistor depends at least in part on a height of the fin structure, wherein a single gate surrounds the dielectric layer, the single gate controlling a flow of current through the channel area and wherein a maximum switching current of the resistivity changing memory element depends at least in part on the height of the fin structure.

* * * * *